(12) United States Patent
Ueda et al.

(10) Patent No.: US 7,713,812 B2
(45) Date of Patent: May 11, 2010

(54) METHOD FOR MANUFACTURING SEMICONDUCTOR THIN FILM

(75) Inventors: Tetsuzo Ueda, Osaka (JP); Hisashi Nakayama, Kyoto (JP); Masaaki Yuri, Osaka (JP)

(73) Assignee: Panasonic Corporation, Osaka (JP)

( * ) Notice: Subject to any disclaimer, the term of this patent is extended or adjusted under 35 U.S.C. 154(b) by 950 days.

(21) Appl. No.: 11/330,213

(22) Filed: Jan. 12, 2006

(65) Prior Publication Data

US 2006/0121695 A1    Jun. 8, 2006

Related U.S. Application Data

(62) Division of application No. 10/382,506, filed on Mar. 7, 2003, now Pat. No. 7,008,839.

(30) Foreign Application Priority Data

Mar. 8, 2002    (JP)    ............... 2002-063013

(51) Int. Cl.
*H01L 21/00* (2006.01)
(52) U.S. Cl. .................. 438/240; 438/761; 438/785
(58) Field of Classification Search ............... 438/240, 438/761, 785
See application file for complete search history.

(56) References Cited

U.S. PATENT DOCUMENTS

| 4,042,726 A | * | 8/1977 | Kaji et al. .................. 438/444 |
| 4,251,300 A | | 2/1981 | Caldwell |
| 4,507,849 A | * | 4/1985 | Shinozaki ................. 438/430 |
| 6,139,628 A | | 10/2000 | Yuri et al. |
| 6,559,075 B1 | | 5/2003 | Kelly et al. |
| 7,008,839 B2 | * | 3/2006 | Ueda et al. .................. 438/240 |

(Continued)

FOREIGN PATENT DOCUMENTS

JP    10-287496    10/1998

(Continued)

OTHER PUBLICATIONS

N.P. Kobayashi et al., "Epitaxial lateral overgrowth of GaN over AlO$_x$ surface formed on Si substrate," Applied Physics Letters, May 10, 1999, vol. 74-19, pp. 2836-2838.

(Continued)

*Primary Examiner*—Laura M Menz
(74) *Attorney, Agent, or Firm*—McDermott Will & Emery LLP

(57) ABSTRACT

A substrate with a second semiconductor layer and a second mask film formed thereon is subjected to a heat treatment in an oxidizing atmosphere. Thus, second oxidized regions are formed through oxidization of the second semiconductor layer in regions of the second semiconductor layer that are not covered by the second mask film. At the same time, a second base layer is formed in each region that is interposed by the second oxidized regions. Then, the second mask film is removed, and a third semiconductor layer is selectively grown on the surface of the second base layer that is exposed between the second oxidized regions so as to cover the second oxidized regions, after which the first oxidized regions and the second oxidized regions covering the entire upper surface of the substrate are removed.

13 Claims, 25 Drawing Sheets

U.S. PATENT DOCUMENTS

| | | | |
|---|---|---|---|
| 7,375,407 B2 * | 5/2008 | Yanagihara et al. | 257/471 |
| 7,524,593 B2 * | 4/2009 | Ohnuma | 430/5 |
| 2003/0162340 A1 | 8/2003 | Tezen | |
| 2003/0186475 A1 * | 10/2003 | Ueda et al. | 438/22 |
| 2006/0108605 A1 * | 5/2006 | Yanagihara et al. | 257/199 |
| 2006/0121695 A1 * | 6/2006 | Ueda et al. | 438/458 |

FOREIGN PATENT DOCUMENTS

| | | |
|---|---|---|
| JP | 11-274082 A | 8/1999 |
| JP | 11-274082 | 10/1999 |
| JP | 11-274563 | 10/1999 |
| JP | 2000-077336 | 3/2000 |
| JP | 2001-501778 | 2/2001 |
| JP | 2001-267242 | 9/2001 |
| WO | WO 01/99155 A | 12/2001 |

OTHER PUBLICATIONS

M. Ikukawa, "ELO of GaN on Si substrate using nitrided Si mask," Extended Abstracts, The $62^{nd}$ Autumn Meeting, Sep. 11, 2001, The Japan Society of Applied Physics, vol. 1, p. 271, 12p-R-6 and a partial English translation thereof.

Japanese Notice of Reasons for Rejection, w/ English translation thereof, issued in Japanese Patent Application No. JP 2003-062031 dated Oct. 13, 2009.

* cited by examiner

LOCALIZED CRYSTAL DEFECTS

US 7,713,812 B2

METHOD FOR MANUFACTURING SEMICONDUCTOR THIN FILM

RELATED APPLICATIONS

This application is a divisional of application Ser. No. 10/382,506, filed on Mar. 7, 2003, now U.S. Pat. No. 7,008,839, which in turn claims the benefit of Japanese Application No. 2002-063013, filed Mar. 8, 2002, the disclosures of which Applications are incorporated by reference herein.

BACKGROUND OF THE INVENTION

The present invention relates to a method for manufacturing a semiconductor thin film that can be used in short-wavelength light emitting diode devices, short-wavelength semiconductor laser devices and high-speed electronic devices.

A group III-V nitride semiconductor material, having a wide forbidden band, can be used in various light emitting devices, such as light emitting diode devices and short-wavelength semiconductor laser devices that are capable of emitting light of a color in a visible region such as blue, green or white. For its high electron saturated drift velocity, in addition to the wide forbidden band, it is also a promising material for electronic devices such as high-frequency devices and high-power devices.

Among others, light emitting diode devices using a nitride semiconductor have already been in practical use in large-size display apparatuses, traffic signals, etc. Particularly, white light emitting diode devices, which give white light by exciting a fluorescent substance with blue or ultraviolet light, can be used in lighting fixtures to replace electric bulbs and fluorescent lamps, and thus bears high expectations. On the other hand, the research and development of semiconductor laser devices has reached a point where samples are being shipped and products are being manufactured although in small quantities, aiming at application in optical disk apparatuses of larger storage capacities.

For the application in semiconductor laser devices, it is important to increase the operating lifetime. To this end, active research and development has been undertaken to reduce the crystal defects in a nitride semiconductor used in a laser device. At present, the most effective method for reducing defects is an epitaxial lateral overgrowth (ELO) method. Specifically, a thin film made of, for example, silicon oxide ($SiO_2$), or the like, is selectively formed on a base layer made of gallium nitride (GaN) so that the formed thin film has openings therein, and the nitride semiconductor is re-grown starting from the gallium nitride surface exposed through the openings. As a result, the crystal growth in the lateral direction (the direction parallel to the substrate surface), which proceeds starting from the openings, becomes dominant on the $SiO_2$ thin film. By promoting the lateral growth, it is possible to significantly reduce the crystal defects occurring in the nitride semiconductor layer, which is grown on the mask film. It has been reported that with this method, the dislocation density, which is about $1 \times 10^9$ $cm^{-2}$ in the prior art, can be reduced to be on the order of $10^6$ $cm^2$.

A semiconductor laser device manufactured by the ELO method has a maximum operating lifetime exceeding 10000 hours, which is substantially sufficient for practical applications. Further reduction of the defect density is expected in order to realize a reliable laser device having an even longer operating lifetime. On the other hand, it has also been reported that when a GaN selective growth layer is grown by the ELO method to a thickness exceeding about 100 μm on a sapphire substrate, the substrate is separated from the selective growth layer while the substrate is being cooled after the crystal growth process, due to the stress caused by the difference between the coefficient of thermal expansion of the substrate and that of the GaN layer.

The separation of the GaN layer from the sapphire substrate provides various advantageous effects, including: the heat radiating property is improved as compared with a case where the sapphire substrate is not separated; an electrode can be formed on the reverse side of the substrate, thereby simplifying the process; and the substrate can be cleaved, thereby realizing a desirable mirror (cavity facet) while reducing the chip size. As a result, it is possible to increase the operating lifetime and the performance of a semiconductor laser device.

A conventional method for manufacturing a semiconductor thin film using the ELO method will now be described.

FIG. 25A and FIG. 25B are cross-sectional views sequentially illustrating steps in the conventional method for manufacturing a semiconductor thin film.

First, as illustrated in FIG. 25A, a first semiconductor layer 102 made of gallium nitride (GaN) and having a thickness of about 1 μm is grown as a base layer on a substrate 101 made of sapphire by a metal organic chemical vapor deposition (MOCVD) method, for example. Then, a mask-forming film made of silicon oxide ($SiO_2$) and having a thickness of about 200 nm is deposited on the first semiconductor layer 102 by a chemical vapor deposition (CVD) method, for example. Then, a resist pattern having a planar stripe pattern (not shown) is formed on the mask-forming film by a photolithography method, and then the mask-forming film is wet-etched with hydrogen fluoride using the formed resist pattern as a mask, thereby forming, from the mask-forming film, a mask film 103 having a stripe pattern.

Next, as illustrated in FIG. 25B, a second semiconductor layer 104 having a thickness of about 100 μm is re-grown (through an ELO process) on the first semiconductor layer 102 with the mask film 103 formed thereon by a hydride vapor phase epitaxy (HVPE) method. In this process, gallium chloride (GaCl), which is a group III source obtained by reacting metal gallium (Ga) with a hydrogen chloride (HCl) gas, and ammonia, which is a nitrogen source, are used as material gases. With the HVPE method, the growth of the second semiconductor layer 104 made of gallium nitride starts from portions of the first semiconductor layer 102 that are exposed through the mask film 103, and the growth proceeds also in the lateral direction so as to cover the top of the mask film 103. After the second semiconductor layer 104 is flattened, the growth proceeds while retaining the flat surface. Since the lateral growth portions on the mask film 103 grow without being influenced by the crystal defects of the base layer, it is possible to significantly reduce the crystal defect density.

After the second semiconductor layer 104 is grown to an intended thickness, the structure is cooled to room temperature. In the cooling process, the substrate 101 is warped into a convex shape due to the difference between the coefficient of thermal expansion of the substrate 101 made of sapphire and that of the first and second semiconductor layers 102 and 104 made of gallium nitride. As a result, the substrate 101 and the first semiconductor layer 102, or the mask film 103 and the second semiconductor layer 104, are detached from each other at the interface therebetween, thereby separating the substrate 101 from the first semiconductor layer 102 or the second semiconductor layer 104.

In the conventional method for manufacturing a semiconductor thin film, by decreasing the size of the openings of the mask film 103 as much as possible, it is possible to make the lateral growth of the second semiconductor layer 104 dominant without being influenced by the defect density of the base layer (the first semiconductor layer 102), whereby it is possible to reduce the defect density in the second semiconductor layer 104.

However, in order to reduce the opening size to a deep submicron level, for example, it is necessary to use a micro pattern exposure system and a micro etching apparatus that have high precisions. Thus, further reducing the defect density in the second semiconductor layer 104 requires high-precision tools, thereby increasing the manufacturing cost.

Moreover, it is not possible to obtain openings of a size below the lower limit, which is dictated by the level of the state-of-the-art microprocessing technology. Thus, the cost of the process and the size of the openings can only be reduced to a certain degree. As a result, there is a limit to the reduction of the crystal defect density in the second semiconductor layer 104 through the miniaturization of the pattern of the mask film 103.

Moreover, when the thickness of the second semiconductor layer 104 is increased, there is a problem occurring in the step of detaching the substrate 101. That is, it is difficult to uniformly and reproducibly obtain a semiconductor layer of a large area due to problems relating to the thickness distribution across the plane of the second semiconductor layer 104 and the reproducibility of the interface condition thereof.

SUMMARY OF THE INVENTION

In view of these problems in the prior art, a first object of the present invention is to reduce, at a low cost, the crystal defect density in the formation of a semiconductor thin film on a single-crystal substrate through a growth process, and a second object of the present invention is to allow for the grown semiconductor thin film and the single-crystal substrate to be separated from each other reproducibly even if the semiconductor thin film has a large area.

In order to achieve the first object, the first invention provides a method for manufacturing a semiconductor thin film, in which a first semiconductor thin film selectively covered by a mask film is oxidized to form oxidized regions in the first semiconductor thin film, and a second semiconductor thin film is selectively grown on the first semiconductor thin film so as to cover the oxidized regions with the oxidized regions being used as a mask for selective growth.

Moreover, in order to achieve the second object, the second invention provides a method similar to that of the first invention, in which after the second semiconductor thin film is again oxidized selectively, a third semiconductor thin film is selectively grown on the second semiconductor thin film so that lower portions of the third semiconductor thin film are covered by the oxidized regions.

Specifically, a first method for manufacturing semiconductor thin film according to the present invention, which achieves the first object, includes: a first step of forming a first semiconductor thin film on a single-crystal substrate; a second step of selectively forming a mask film with a plurality of openings therein on the first semiconductor thin film; a fourth step of subjecting the first semiconductor thin film with the mask film formed thereon to a heat treatment in an oxidizing atmosphere to oxidize portions of the first semiconductor thin film that are exposed through the openings of the mask film and a vicinity thereof, thereby forming a plurality of oxidized regions in the first semiconductor thin film; and a fifth step of removing the mask film to expose the first semiconductor thin film and then forming a second semiconductor thin film on the exposed first semiconductor thin film so as to cover the plurality of oxidized regions.

With the first method for manufacturing a semiconductor thin film, the oxidization process for the first semiconductor thin film whose upper surface is masked proceeds also in the direction parallel to the substrate surface (the lateral direction), whereby the width dimension of the first semiconductor thin film interposed by the oxidized regions can be reduced as compared with a case where a mask pattern is used for the formation. As a result, the interval between oxidized regions to be a mask when forming the second semiconductor thin film can be reduced without using a high-precision pattern exposure system or an etching apparatus capable of performing minute processing, whereby the second semiconductor thin film to be selectively grown on the first semiconductor thin film being the base crystal is less influenced by the crystal defects in the first semiconductor thin film, which is the base layer, and the crystal defect density of the second semiconductor thin film can be reduced. Moreover, since the oxidization of the first semiconductor thin film mostly proceeds inward, the difference between the height of the surface of the first semiconductor thin film and that of the surface of the oxidized region can be reduced from that in the prior art where silicon oxide, or the like, is used. As a result, the lateral growth occurs in an early stage of the selective growth process, whereby direct growth on the upper surface of the oxidized region can be suppressed, and the crystallinity of the second semiconductor thin film on the oxidized region can be improved.

It is preferred that the first method for manufacturing a semiconductor thin film further includes, after the fifth step, a sixth step of separating the substrate from the first semiconductor thin film.

In such a case, it is preferred that the method further includes, between the fifth step and the sixth step, a seventh step of bonding a support substrate made of a material different from that of the second semiconductor thin film on an upper surface of the second semiconductor thin film.

In such a case, it is preferred that the sixth step includes a step of irradiating the substrate with irradiation light whose energy is smaller than a forbidden band width of a material of the substrate and is larger than a forbidden band width of a material of the first semiconductor thin film.

In such a case, it is preferred that the irradiation light is pulsed laser light.

Alternatively, in such a case, it is preferred that the irradiation light is an emission line of a mercury lamp.

Furthermore, it is preferred that the sixth step includes a step of heating the substrate.

Moreover, it is preferred that in the sixth step, the irradiation light is radiated so as to scan a surface of the substrate.

Moreover, it is preferred that the sixth step includes a step of removing at least one of the substrate and the oxidized regions by wet etching.

In such a case, it is preferred that the wet etching is performed by using an acidic solution or an alkaline solution.

A second method for manufacturing a semiconductor thin film according to the present invention, which achieves the first object, includes: a first step of forming a first semiconductor thin film on a single-crystal substrate; a second step of selectively forming a mask film with a plurality of openings therein on the first semiconductor thin film; a fourth step of subjecting the first semiconductor thin film with the mask film formed thereon to a heat treatment in an oxidizing atmosphere to oxidize portions of the first semiconductor thin film that are exposed through the openings of the mask film and a vicinity thereof, thereby forming a plurality of oxidized regions in the first semiconductor thin film; a fifth step of removing the mask film to expose the first semiconductor thin film and then forming a plurality of second semiconductor thin films on the exposed first semiconductor thin film so that the plurality of oxidized regions have exposed portions; and a sixth step of removing the plurality of oxidized regions and then forming a third semiconductor thin film so that the third semiconductor thin film contacts and covers the second semiconductor thin films.

With the second method for manufacturing a semiconductor thin film, a gap portion where no oxidized region exists is formed under the third semiconductor thin film, whereby the stress in the thin film can be reduced as compared with a case where an oxidized region is left unremoved, and the crystallinity of the third semiconductor thin film can be further improved.

It is preferred that the second method for manufacturing a semiconductor thin film further includes, after the sixth step, a seventh step of separating the substrate from the first semiconductor thin film.

It is preferred that the second method for manufacturing a semiconductor thin film further includes, between the sixth step and the seventh step, an eighth step of bonding a support substrate made of a material different from that of the third semiconductor thin film on an upper surface of the third semiconductor thin film.

In such a case, it is preferred that the seventh step includes a step of irradiating the substrate with irradiation light whose energy is smaller than a forbidden band width of a material of the substrate and is larger than a forbidden band width of a material of the first semiconductor thin film.

In such a case, it is preferred that the irradiation light is pulsed laser light.

Alternatively, in such a case, it is preferred that the irradiation light is an emission line of a mercury lamp.

Furthermore, it is preferred that the seventh step includes a step of heating the substrate.

Moreover, it is preferred that in the seventh step, the irradiation light is radiated so as to scan a surface of the substrate.

Moreover, it is preferred that the seventh step includes a step of removing at least one of the substrate and the oxidized regions by wet etching.

In such a case, it is preferred that the wet etching is performed by using an acidic solution or an alkaline solution.

A third method for manufacturing a semiconductor thin film according to the present invention, which achieves the first object, includes: a first step of forming a first semiconductor thin film on a single-crystal substrate; a second step of selectively forming a first mask film with a plurality of openings therein on the first semiconductor thin film; a fourth step of subjecting the first semiconductor thin film with the first mask film formed thereon to a heat treatment in an oxidizing atmosphere to oxidize portions of the first semiconductor thin film that are exposed through the openings of the first mask film and a vicinity thereof, thereby forming a plurality of first oxidized regions in the first semiconductor thin film; a fifth step of removing the first mask film to expose the first semiconductor thin film and then forming a second semiconductor thin film on the exposed first semiconductor thin film so as to cover the plurality of first oxidized regions; a sixth step of forming a second mask film so that the second mask film masks regions of the second semiconductor thin film that are above portions of the first semiconductor thin film interposed by the first oxidized regions and has openings above the first oxidized regions; a seventh step of subjecting the second semiconductor thin film with the second mask film formed thereon to a heat treatment in an oxidizing atmosphere to oxidize portions of the second semiconductor thin film that are exposed through the openings of the second mask film and a vicinity thereof, thereby forming a plurality of second oxidized regions in the second semiconductor thin film; and an eighth step of removing the second mask film to expose the second semiconductor thin film and then forming a third semiconductor thin film on the exposed second semiconductor thin film so as to cover the plurality of second oxidized regions.

With the third method for manufacturing a semiconductor thin film, each portion where the laterally-growing opposing end surfaces of the second semiconductor thin film are connected to each other can be turned into the second oxidized region, which is used as a mask for selective growth when growing the third semiconductor thin film. Normally, the crystal orientation does not match completely in a portion where the laterally-growing opposing end surfaces are connected to each other. The shift in orientation angle is more significant as the planar area of a mask region (the first oxidized region), e.g., the width dimension of the mask in a case where the mask has a stripe pattern, is larger. However, with the manufacturing method of the present invention, the third semiconductor thin film is re-grown with the connected portion of the second semiconductor thin film being again used as a mask region (the second oxidized region), whereby the planar area of the mask region (the second oxidized region) can be reduced in the second re-growth step. Therefore, the third semiconductor thin film can be re-grown without being influenced by the shift in the crystal orientation occurring when growing the second semiconductor thin film, whereby the crystallinity of the third semiconductor thin film can be improved.

It is preferred that the third method for manufacturing a semiconductor thin film further includes, between the seventh step and the eighth step, a step of removing the first oxidized regions and the second oxidized regions.

A fourth method for manufacturing a semiconductor thin film according to the present invention, which achieves the second object, includes: a first step of forming a first semiconductor thin film on a single-crystal substrate; a second step of selectively forming a first mask film with a plurality of openings therein on the first semiconductor thin film; a fourth step of subjecting the first semiconductor thin film with the first mask film formed thereon to a heat treatment in an oxidizing atmosphere to oxidize portions of the first semiconductor thin film that are exposed through the openings of the first mask film and a vicinity thereof, thereby forming a plurality of first oxidized regions in the first semiconductor thin film; a fifth step of removing the first mask film to expose the first semiconductor thin film and then forming a second semiconductor thin film on the exposed first semiconductor thin film so as to cover the plurality of first oxidized regions; a sixth step of forming a second mask film so that the second mask film has a plurality of openings for exposing therethrough portions of the second semiconductor thin film that are above portions of the first semiconductor thin film interposed by the first oxidized regions; a seventh step of subjecting the second semiconductor thin film with the second mask film formed thereon to a heat treatment in an oxidizing atmosphere to oxidize portions of the second semiconductor thin film that are exposed through the openings of the second mask film and a vicinity thereof, thereby forming a plurality of second oxidized regions in the second semiconductor thin film; and an eighth step of removing the second mask film to expose the second semiconductor thin film and then forming a third semiconductor thin film on the exposed second semiconductor thin film so as to cover the plurality of second oxidized regions.

With the fourth method for manufacturing a semiconductor thin film, the first oxidized regions and the second oxidized regions are connected together, whereby the substrate is separated from the second semiconductor thin film by removing the first oxidized regions and the second oxidized regions, thus realizing uniform separation of a substrate with a large area. Moreover, the separated substrate can be reused as a substrate for forming another semiconductor thin film, whereby the manufacturing cost can be reduced.

In the fourth method for manufacturing a semiconductor thin film, it is preferred that in the seventh step, the second oxidized regions are formed so that an entire surface of the first semiconductor thin film including the first oxidized regions is oxidized.

It is preferred that the fourth method for manufacturing a semiconductor thin film further includes, after the eighth step, a ninth step of separating the substrate from the first semiconductor thin film.

In such a case, it is preferred that the method further includes, between the eighth step and the ninth step, a tenth step of bonding a support substrate made of a material different from that of the third semiconductor thin film on an upper surface of the third semiconductor thin film.

In such a case, it is preferred that the ninth step includes a step of irradiating the substrate with irradiation light whose energy is smaller than a forbidden band width of a material of the substrate and is larger than a forbidden band width of a material of the first semiconductor thin film.

In such a case, it is preferred that the irradiation light is pulsed laser light.

Moreover, in such a case, it is preferred that the irradiation light is an emission line of a mercury lamp.

Furthermore, it is preferred that the ninth step includes a step of heating the substrate.

In such a case, it is preferred that in the ninth step, the irradiation light is radiated so as to scan a surface of the substrate.

Moreover, it is preferred that the ninth step includes a step of removing at least one of the substrate and the oxidized regions by wet etching.

In such a case, it is preferred that the wet etching is performed by using an acidic solution or an alkaline solution.

In the first to fourth methods for manufacturing a semiconductor thin film, it is preferred that the substrate is made of sapphire, silicon carbide, lithium aluminum oxide, lithium gallium oxide, lithium gallium aluminum oxide ($LiGa_xAl_{1-x}O_2$ (where $0 \leq x \leq 1$)), silicon, gallium arsenide, indium phosphide or gallium phosphide.

A fifth method for manufacturing a semiconductor thin film according to the present invention, which achieves the first object, includes: a first step of selectively forming a first mask film on a single-crystal substrate; a second step of subjecting the substrate with the first mask film formed thereon to a heat treatment in an oxidizing atmosphere to oxidize portions of the substrate that are in a vicinity of, and around, the first mask film, thereby forming a plurality of first oxidized regions in the substrate; and a third step of removing the first mask film to expose the substrate and then forming a first semiconductor thin film so as to cover an upper surface of the substrate including the plurality of first oxidized regions.

With the fifth method for manufacturing a semiconductor thin film, even if a material that itself is oxidized is used for the substrate, the interval between oxidized regions is reduced, as in the first method for manufacturing a semiconductor thin film of the present invention, whereby the first semiconductor thin film can be laterally grown from an opening having a reduced size, thus reducing the crystal defect density of the first semiconductor thin film.

It is preferred that the fifth method for manufacturing a semiconductor thin film further includes, after the third step, a fourth step of separating the substrate from the first semiconductor thin film.

In such a case, it is preferred that the method further includes, between the third step and the fourth step, a fifth step of bonding a support substrate made of a material different from that of the first semiconductor thin film on the upper surface of the first semiconductor thin film.

Moreover, it is preferred that the fourth step includes a step of removing at least one of the substrate and the oxidized regions by wet etching.

In such a case, it is preferred that the wet etching is performed by using an acidic solution or an alkaline solution.

It is preferred that the fifth method for manufacturing a semiconductor thin film further includes, after the third step: a fourth step of forming a second mask film so that the second mask film has a plurality of openings for exposing therethrough portions of the first semiconductor thin film that are interposed by the first oxidized regions; a fifth step of subjecting the first semiconductor thin film with the second mask film formed thereon to a heat treatment in an oxidizing atmosphere to oxidize portions of the first semiconductor thin film that are exposed through the openings of the second mask film and a vicinity thereof, thereby forming a plurality of second oxidized regions in the first semiconductor thin film; and a sixth step of removing the second mask film to expose the first semiconductor thin film and then forming a second semiconductor thin film on the exposed first semiconductor thin film so as to cover the plurality of second oxidized regions.

In this way, the first oxidized regions and the second oxidized regions are connected together, whereby the substrate is separated from the second semiconductor thin film by removing the first oxidized regions and the second oxidized regions. Therefore, the separated substrate can be reused as a substrate for forming another semiconductor thin film, thereby achieving the second object.

In the fifth method for manufacturing a semiconductor thin film, it is preferred that in the fifth step, the second oxidized regions are formed so that an entire surface of the substrate including the first oxidized regions is oxidized.

It is preferred that the fifth method for manufacturing a semiconductor thin film further includes, after the third step: a fourth step of forming a second mask film so that the second mask film masks regions of the first semiconductor thin film that are interposed by the first oxidized regions and has openings above the first oxidized regions; a fifth step of subjecting the first semiconductor thin film with the second mask film formed thereon to a heat treatment in an oxidizing atmosphere to oxidize portions of the first semiconductor thin film that are exposed through the openings of the second mask film and a vicinity thereof, thereby forming a plurality of second oxidized regions in the first semiconductor thin film; and a sixth step of removing the second mask film to expose the first semiconductor thin film and then forming a second semiconductor thin film on the exposed first semiconductor thin film so as to cover the plurality of second oxidized regions.

It is preferred that the fifth method for manufacturing a semiconductor thin film further includes, between the fifth step and the sixth step, a step of removing the first oxidized regions and the second oxidized regions.

It is preferred that the fifth method for manufacturing a semiconductor thin film further includes, after the sixth step, a seventh step of separating the substrate from the first semiconductor thin film.

It is preferred that the fifth method for manufacturing a semiconductor thin film further includes, between the sixth step and the seventh step, an eighth step of bonding a support substrate made of a material different from that of the second semiconductor thin film on an upper surface of the second semiconductor thin film.

Moreover, it is preferred that the seventh step includes a step of removing at least one of the substrate and the oxidized regions by wet etching.

In such a case, it is preferred that the wet etching is performed by using an acidic solution or an alkaline solution.

A sixth method for manufacturing a semiconductor thin film according to the present invention, which achieves the second object, includes: a first step of selectively forming a first mask film on a single-crystal substrate; a second step of subjecting the substrate with the mask film formed thereon to a heat treatment in an oxidizing atmosphere to oxidize portions of the substrate that are in a vicinity of, and around, the mask film, thereby forming a plurality of oxidized regions in the substrate; a third step of removing the mask film to expose the substrate and then forming a plurality of first semiconductor thin films on the exposed substrate so that the plurality of oxidized regions have exposed portions; and a fourth step of removing the plurality of oxidized regions and then forming a second semiconductor thin film so that the second semiconductor thin film contacts and covers the first semiconductor thin films.

With the sixth method for manufacturing a semiconductor thin film, even if a material that itself is oxidized is used for the substrate, the second semiconductor thin film is formed so that the second semiconductor thin film contacts and covers the first semiconductor thin films after a plurality of oxidized regions are removed by, for example, etching, or the like, as in the second method for manufacturing a semiconductor thin film of the present invention, whereby a gap portion where no oxidized region exists is formed under the second semiconductor thin film. As a result, the stress in the thin film can be reduced as compared with a case where an oxidized region is left unremoved, and the crystallinity of the second semiconductor thin film can be further improved.

It is preferred that the sixth method for manufacturing a semiconductor thin film further includes, after the fourth step, a fifth step of separating the substrate from the first semiconductor thin film.

It is preferred that the sixth method for manufacturing a semiconductor thin film further includes, between the fourth step and the fifth step, a sixth step of bonding a support substrate made of a material different from that of the first semiconductor thin film on an upper surface of the first semiconductor thin film.

Moreover, it is preferred that the fifth step includes a step of removing at least one of the substrate and the oxidized regions by wet etching.

In such a case, it is preferred that the wet etching is performed by using an acidic solution or an alkaline solution.

In the fifth or sixth method for manufacturing a semiconductor thin film, it is preferred that the substrate is made of silicon carbide, silicon, gallium arsenide, indium phosphide or gallium phosphide.

In the first or sixth method for manufacturing a semiconductor thin film, it is preferred that at least one of the first semiconductor thin film and the second semiconductor thin film is made of a group III-V nitride semiconductor or silicon carbide.

In the second to fourth methods for manufacturing a semiconductor thin film, it is preferred that at least one of the first semiconductor thin film, the second semiconductor thin film and the third semiconductor thin film is made of a group III-V nitride semiconductor or silicon carbide.

In the fifth method for manufacturing a semiconductor thin film, it is preferred that the first semiconductor thin film is made of a group III-V nitride semiconductor or silicon carbide.

Thus, with a wide gap semiconductor, the crystal growth of which is generally considered difficult, such as a group III-V nitride semiconductor made of InGaAlN or silicon carbide (SiC), the crystallinity can be improved significantly by promoting the lateral growth (ELO) thereof. Moreover, where the semiconductor thin film of the present invention is used in a device, the parasitic capacitance can be reduced by providing the oxidized regions under the active layer such as the channel portion of a field effect transistor, for example.

In the first or sixth method for manufacturing a semiconductor thin film, it is preferred that at least one of the first semiconductor thin film and the second semiconductor thin film is deposited by a vapor deposition method, a metal organic chemical vapor deposition method, a hydride vapor phase epitaxy method or a molecular beam epitaxy method.

In the second to fourth methods for manufacturing a semiconductor thin film, at least one of the first semiconductor thin film, the second semiconductor thin film and the third semiconductor thin film is deposited by a vapor deposition method, a metal organic chemical vapor deposition method, a hydride vapor phase epitaxy method or a molecular beam epitaxy method.

In the fifth method for manufacturing a semiconductor thin film, it is preferred that the first semiconductor thin film is deposited by a vapor deposition method, a metal organic chemical vapor deposition method, a hydride vapor phase epitaxy method or a molecular beam epitaxy method.

In the first or sixth method for manufacturing a semiconductor thin film, it is preferred that the first semiconductor thin film and the second semiconductor thin film are deposited by different deposition methods.

In the second to fourth methods for manufacturing a semiconductor thin film, it is preferred that two of the first semiconductor thin film, the second semiconductor thin film and the third semiconductor thin film are deposited by different deposition methods.

In the first to sixth methods for manufacturing a semiconductor thin film, it is preferred that the oxidizing atmosphere is an oxygen gas.

In the first to sixth methods for manufacturing a semiconductor thin film, it is preferred that the oxidizing atmosphere contains water vapor.

In the first to sixth methods for manufacturing a semiconductor thin film, it is preferred that the support substrate is made of silicon, gallium arsenide, indium phosphide, gallium phosphide or a metal.

BRIEF DESCRIPTION OF THE DRAWINGS

FIG. 2A and FIG. 2B each show the surface condition of an oxidized region obtained by using the method for manufacturing a semiconductor thin film according to the first embodiment of the present invention, wherein FIG. 2A is an AFM image taken where thermal oxidization is performed in a water-vapor-containing atmosphere, and FIG. 2B is an AFM image taken where thermal oxidization is performed in an oxygen atmosphere.

FIG. 3A and FIG. 3B are cross-sectional views each showing an oxidized region obtained by using the method for manufacturing a semiconductor thin film according to the first embodiment of the present invention, wherein FIG. 3A is an SEM image taken where thermal oxidization is performed in a water-vapor-containing atmosphere, and FIG. 3B is an SEM image taken where thermal oxidization is performed in an oxygen atmosphere.

DETAILED DESCRIPTION OF THE INVENTION

First Embodiment

The first embodiment of the present invention will now be described with reference to the drawings.

Figure 1A:
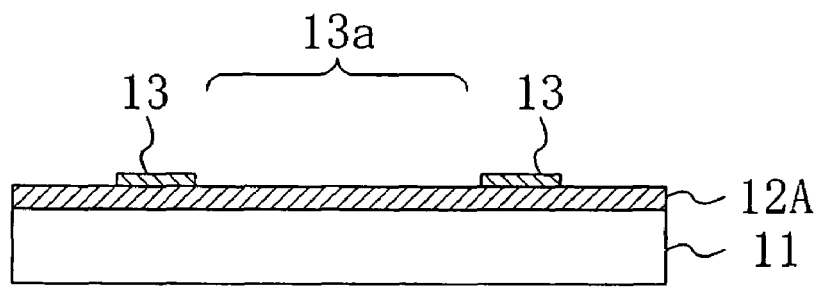
FIG. 1A to FIG. 1C are cross-sectional views sequentially illustrating steps in a method for manufacturing a semiconductor thin film according to a first embodiment of the present invention.
Figure 1B:
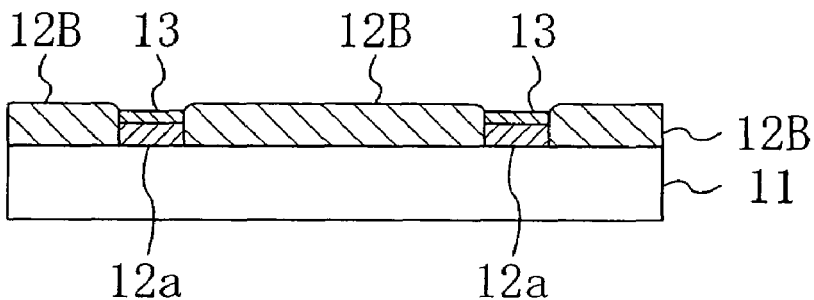
Figure 1C:
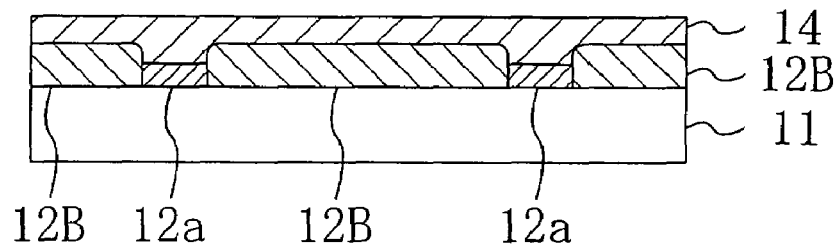

FIG. 1A to FIG. 1C are cross-sectional views sequentially illustrating steps in a method for manufacturing a semiconductor thin film according to the first embodiment of the present invention.

As illustrated in FIG. 1A, first, a first semiconductor layer 12A made of gallium nitride (GaN) and having a thickness of about 1 μm is grown on the principal surface of a sapphire (single-crystal $Al_2O_3$) substrate 11 by a metal organic chemical vapor deposition (MOCVD) method, for example, using trimethylgallium (TMGa) as a group III source and ammonia ($NH_3$) as a nitrogen source. Herein, a so-called a low-temperature buffer layer may be provided between the substrate 11 and the first semiconductor layer 12A for relieving the lattice mismatch between the substrate 11 and the nitride semiconductor grown on the substrate 11. For example, the low-temperature buffer layer is made of aluminum nitride (AlN) that is deposited at a relatively low temperature of about 500° C. to a relatively small thickness of about 50 nm. Only a portion of the substrate 11, which has a shape of a wafer, is shown in FIG. 1A, as is also the case in other embodiments to follow.

Then, a mask-forming film made of silicon (Si) and having a thickness of about 100 nm is deposited on the first semiconductor layer 12A by, for example, a chemical vapor deposition (CVD) method in which monosilane ($SiH_4$) is decomposed. Then, a resist pattern having a planar stripe pattern (not shown) is formed on the mask-forming film by a photolithography method, and then the mask-forming film is dry-etched by reactive ion etching (RIE) with a reactive gas containing hydrogen bromide (HBr) or chlorine ($Cl_2$) using the formed resist pattern as a mask, thereby forming, from the mask-forming film, a mask film 13 having a stripe pattern with an opening 13a therein. Then, the resist pattern is removed by ashing, or the like. Herein, an optical pattern exposure system capable of performing minute processing with a resolution of about 0.5 μm or better in terms of pattern width, such as a contact mask aligner apparatus or a g-ray stepper, is used. Note that while a stripe pattern is used as the planar shape of the mask film 13, it may alternatively be a dotted (island-like) pattern.

Next, as illustrated in FIG. 1B, the substrate 11 with the first semiconductor layer 12A and the mask film 13 formed thereon is subjected to a heat treatment at a temperature of 900° C. for about 4 hours, for example, in an oxidizing atmosphere, e.g., an oxygen ($O_2$) gas or a water vapor ($H_2O$)-containing atmosphere. Through the heat treatment, a plurality of oxidized regions 12B made of gallium oxide are formed through oxidation of the first semiconductor layer 12A in regions of the first semiconductor layer 12A that are not covered by the mask film 13. As a result, a base layer 12a made of gallium nitride is formed in each region of the first semiconductor layer 12A that is interposed by adjacent oxidized regions 12B. Herein, the oxidation of the oxidized regions 12B proceeds also in the direction parallel to the substrate surface (the lateral direction), whereby if the width dimension of the mask film 13 is set to be 0.5 μm in the patterning process, for example, the width dimension of the base layer 12a after the oxidization process can be as small as about 0.25 μm. Moreover, since an oxygen gas or a water-vapor-containing atmosphere is used as an oxidizing atmosphere for selectively oxidizing the oxidized regions 12B, a quick and uniform oxidization process can be performed reproducibly.

Next, as illustrated in FIG. 1C, the mask film 13 is removed by hydrofluoric-nitric acid or an RIE method, and then a second semiconductor layer 14 made of gallium nitride is selectively grown (through an ELO process) by an MOCVD method on the surface of the base layer 12a that is exposed between the plurality of oxidized regions 12B so as to cover the oxidized regions 12B while flattening the upper surface thereof.

As described above, in the first embodiment, during the growth of the second semiconductor layer 14, the lateral growth becomes dominant over the oxidized regions 12B. Therefore, the second semiconductor layer 14 is not influenced by the surface of the base layer 12a made of the first semiconductor layer 12A over the oxidized regions 12B, whereby the crystal defect density of the second semiconductor layer 14 can be reduced.

As described above, the opening size of the base layer 12a made of gallium nitride can be made smaller than the width dimension of the mask film 13. Therefore, if the mask film 13 is patterned by using a state-of-the-art pattern exposure system whose resolution is on the 0.1 μm level, the width dimension of the base layer 12a can be further reduced, whereby the crystallinity of the second semiconductor layer 14 to be re-grown is even less likely to be influenced by the surface of the base layer 12a.

Moreover, the thickness of the oxidized regions 12B can be reduced by shortening the oxidization time when forming the oxidized regions 12B illustrated in FIG. 1B. In this way, the difference between the height of the surface of the base layer 12a and that of the surface of the oxidized regions 12B can be reduced, whereby when the second semiconductor layer 14 is re-grown, the lateral growth is dominant from the initial stage of the growth of the second semiconductor layer 14. As a result, the crystal growth on the oxidized regions 12B can be prevented, whereby it is possible to prevent the crystallinity of the second semiconductor layer 14 from deteriorating due to crystals produced on the oxidized regions 12B.

Note that the growth method for the second semiconductor layer 14 is not limited to an MOCVD method. In order to obtain a larger thickness, a hydride vapor phase epitaxy (HVPE) method having a higher growth rate than an MOCVD method may be used.

Furthermore, a growth method that has a low growth rate but provides a high crystallinity may be used in combination. For example, a molecular beam epitaxy (MBE) method may be used for growing the first semiconductor layer 12A to be selectively oxidized, while an HVPE method is used for growing the second semiconductor layer 14. In this way, the crystallinity of the first semiconductor layer 12A, which is the base layer for the second semiconductor layer 14, is improved, thereby improving the crystallinity of the second semiconductor layer 14. In addition, this makes it easier to reduce the thickness of the second semiconductor layer 14.

Moreover, while sapphire (single-crystal $Al_2O_3$) is used for the single-crystal substrate 11, silicon carbide (SiC), lithium aluminum oxide ($LiAlO_2$), lithium gallium oxide ($LiGaO_2$), or a mixed crystal thereof, i.e., lithium gallium aluminum oxide ($LiGa_xAl_{1-x}O_2$ (where $0 \leq x \leq 0.1$)), may alternatively be used instead of sapphire. In this way, a group III-V compound semiconductor with a reduced lattice mismatch and a desirable crystallinity, specifically, a semiconductor thin film made of $In_xGa_yAl_zN_vAs_w$ (where x+y+z=1, $0 \leq x$, y, $z \leq 1$, v+w=1, $0 \leq v$, $w \leq 1$) can be grown on the substrate 11.

Furthermore, when silicon carbide is used for the substrate 11, a silicon carbide thin film having a desirable crystallinity can be formed on the substrate 11. Moreover, silicon (Si), gallium arsenide (GaAs), indium phosphide (InP) or gallium phosphide (GaP) is used for the substrate 11, it is possible to obtain a substrate with a desirable crystallinity, and to form a semiconductor thin film having a desirable crystallinity on the substrate 11.

The present inventors have confirmed that there is a difference in the surface condition of the obtained oxidized regions 12B between when an oxygen ($O_2$) gas is used as the oxidizing atmosphere for the selective oxidization of the first semiconductor layer 12A illustrated in FIG. 1B and when a mixed atmosphere of water vapor ($H_2O$) and a nitrogen ($N_2$) gas is used.

For example, a mixed gas of water vapor and nitrogen is produced by bubbling water heated to 100° C. with a nitrogen gas, and the produced mixed gas is introduced onto the first semiconductor layer 12A heated to about 1000° C. Through the heat treatment in a water-vapor-containing oxidizing atmosphere, the oxidized regions 12B whose composition is represented as $Ga_2O_3$ is formed in the exposed portions of the first semiconductor layer 12A made of gallium nitride (GaN).

Figure 2A:
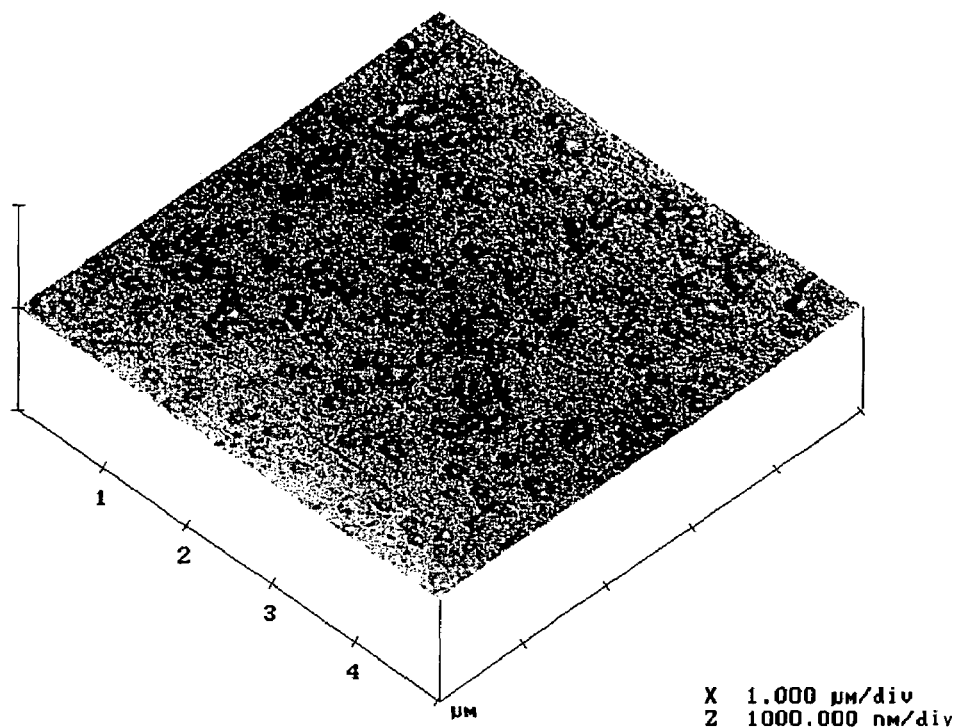
Figure 2B:
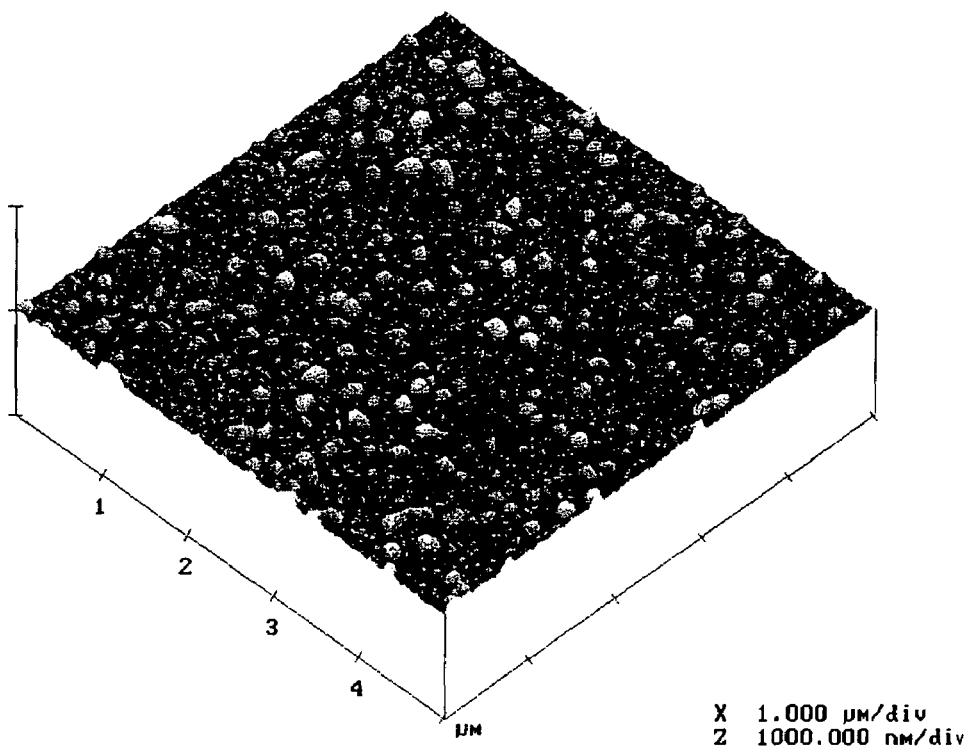
Figure 3A:
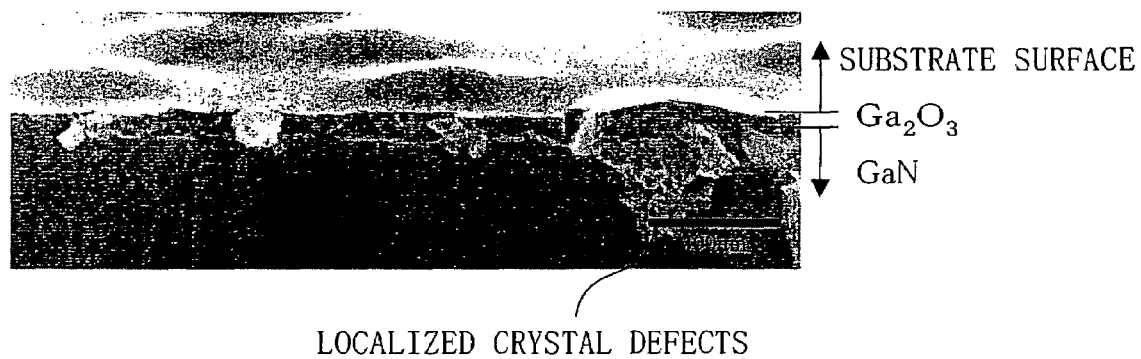
Figure 3B:
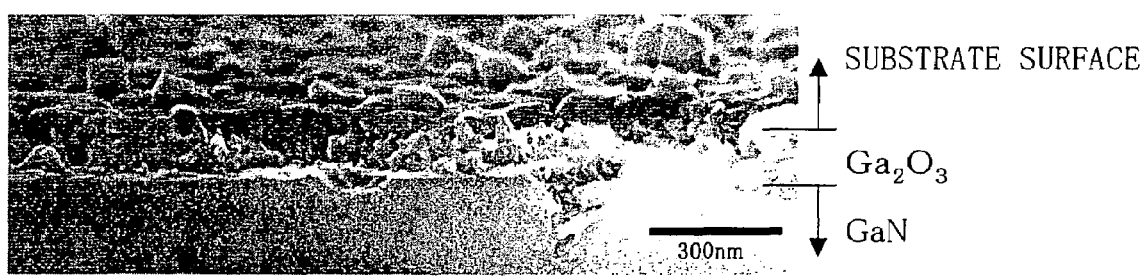

FIG. 2A shows the surface condition of the oxidized region made of $Ga_2O_3$, which have been oxidized by a water-vapor-containing atmosphere as observed by an atomic force microscope (AFM). Moreover, FIG. 3A shows a cross section of the oxidized region, which have been oxidized by a water-vapor-containing atmosphere as observed by a scanning electron microscope (SEM). On the other hand, FIG. 2B and FIG. 3B show the surface condition and a cross section, respectively, of the oxidized region made of $Ga_2O_3$, which have been oxidized by an oxygen atmosphere.

As can be seen from FIG. 2A and FIG. 3A, the flatness of the surface of the oxidized region made of $Ga_2O_3$ is significantly improved by thermal oxidization with a water-vapor-containing atmosphere, as compared with thermal oxidization with an oxygen atmosphere. Moreover, it can be seen from FIG. 3A that in a part of the oxidized region, oxidization proceeds in a pillar-like (lump-like) pattern with the surface thereof protruding in a convex shape. Observation of the cross section of such a pillar-like portion with a transmission electron microscope (TEM) has confirmed that crystal dislocations (defects) are localized in the pillar-like oxidized portion. Therefore, it can be seen that the oxidized regions 12B with a higher flatness can be obtained by selectively oxidizing regions where the crystal defect density has been reduced.

In view of the above, the flatness of the surface of the oxidized regions 12B can be improved reliably by performing a selective thermal oxidization process with a water-vapor-containing atmosphere and on the first semiconductor layer 12A with fewer crystal defects. As a result, in the step illustrated in FIG. 1C, the second semiconductor layer 14 is selectively grown on the oxidized regions 12B with a desirable surface flatness, and the abnormal growth of the second semiconductor layer 14 is suppressed, whereby it is possible to reliably form the second semiconductor layer 14 with a desirable flatness and a desirable crystallinity.

Second Embodiment

The second embodiment of the present invention will now be described with reference to the drawings.

FIG. 4A to FIG. 4D and FIG. 5A and FIG. 5B are cross-sectional views sequentially illustrating steps in a method for manufacturing a semiconductor thin film according to the second embodiment of the present invention.

Figure 4A:
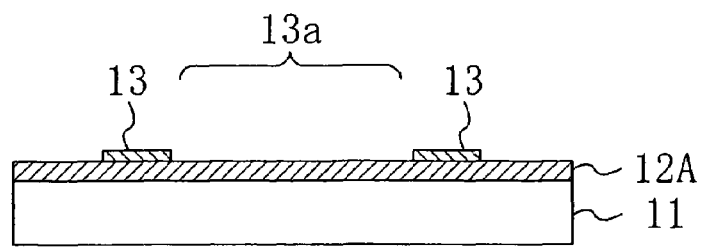
FIG. 4A to FIG. 4D are cross-sectional views sequentially illustrating steps in a method for manufacturing a semiconductor thin film according to a second embodiment of the present invention.

First, as illustrated in FIG. 4A, the first semiconductor layer 12A made of gallium nitride and having a thickness of about 1 μm is grown on the principal surface of the substrate 11 made of sapphire by an MOCVD method using trimethylgallium as a group III source and ammonia as a nitrogen source. Again, a low-temperature buffer layer may be provided between the substrate 11 and the first semiconductor layer 12A.

Then, a mask-forming film made of silicon and having a thickness of about 100 nm is deposited on the first semiconductor layer 12A by, for example, a CVD method in which monosilane is decomposed. Then, a resist pattern having a planar stripe pattern (not shown), for example, is formed on the mask-forming film by a photolithography method, and then the mask-forming film is dry-etched by an RIE method with a reactive gas containing hydrogen bromide or chlorine using the formed resist pattern as a mask, thereby forming, from the mask-forming film, the mask film 13 having a stripe pattern with the opening 13a therein. Then, the resist pattern is removed by ashing, or the like. Again, an optical pattern exposure system capable of performing minute processing with a resolution of about 0.5 μm or better in terms of pattern width, such as a contact mask aligner or a g-ray stepper, is used. Note that while a stripe pattern is used as the planar shape of the mask film 13, it may alternatively be a dotted (island-like) pattern.

Figure 4B:
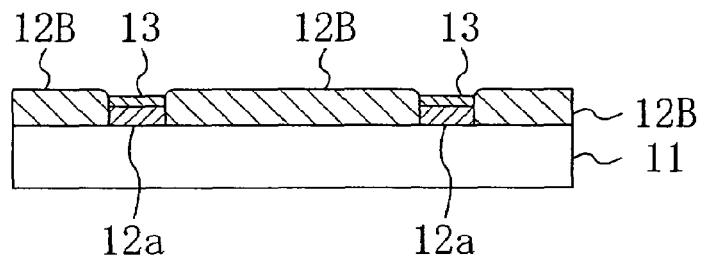

Next, as illustrated in FIG. 4B, the substrate 11 with the first semiconductor layer 12A and the mask film 13 formed thereon is subjected to a heat treatment at a temperature of 900° C. for about 4 hours, for example, in an oxygen gas or a water-vapor-containing atmosphere. Through the heat treatment, the plurality of oxidized regions 12B made of gallium oxide are formed through oxidization of the first semiconductor layer 12A in regions of the first semiconductor layer 12A that are not covered by the mask film 13. As a result, the base layer 12a made of gallium nitride is formed in each region of the first semiconductor layer 12A that is interposed by adjacent oxidized regions 12B. Herein, the oxidization of the oxidized regions 12B proceeds also in the direction parallel to the substrate surface (the lateral direction), whereby if the width dimension of the mask film 13 is set to be 0.5 μm in the patterning process, for example, the width dimension of the base layer 12a after the oxidization process can be as small as about 0.25 μm.

Figure 4C:
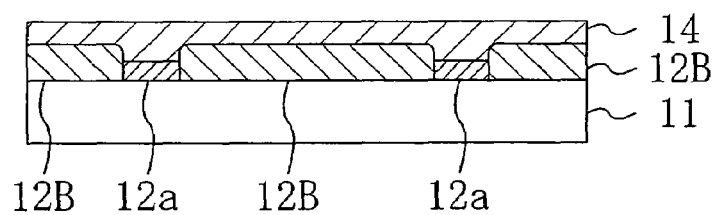

Next, as illustrated in FIG. 4C, the mask film 13 is removed by hydrofluoric-nitric acid or an RIE method, and then the second semiconductor layer 14 made of gallium nitride is selectively grown (through an ELO process) by an MOCVD method on the surface of the base layer 12a that is exposed between the plurality of oxidized regions 12B so as to cover the oxidized regions 12B.

Figure 4D:
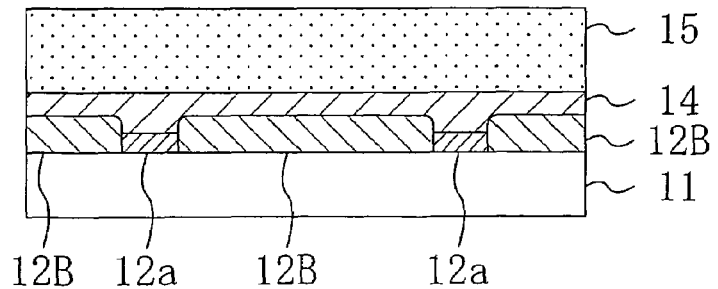

Next, as illustrated in FIG. 4D, a support substrate 15 made of silicon (Si) whose principal surface is oriented along the (100) plane is bonded to the upper surface of the second semiconductor layer 14 by a bonding method. Note that in a case where the thickness of the second semiconductor layer 14 can be sufficiently increased to be 100 μm or more, the support substrate 15 may not need to be bonded. Moreover, while silicon is used for the support substrate 15, gallium arsenide (GaAs) whose principal surface is oriented along the (100) plane, indium phosphide (InP), gallium phosphide (GaP) or a metal such as copper (Cu) may alternatively be used instead of silicon.

Figure 5A:
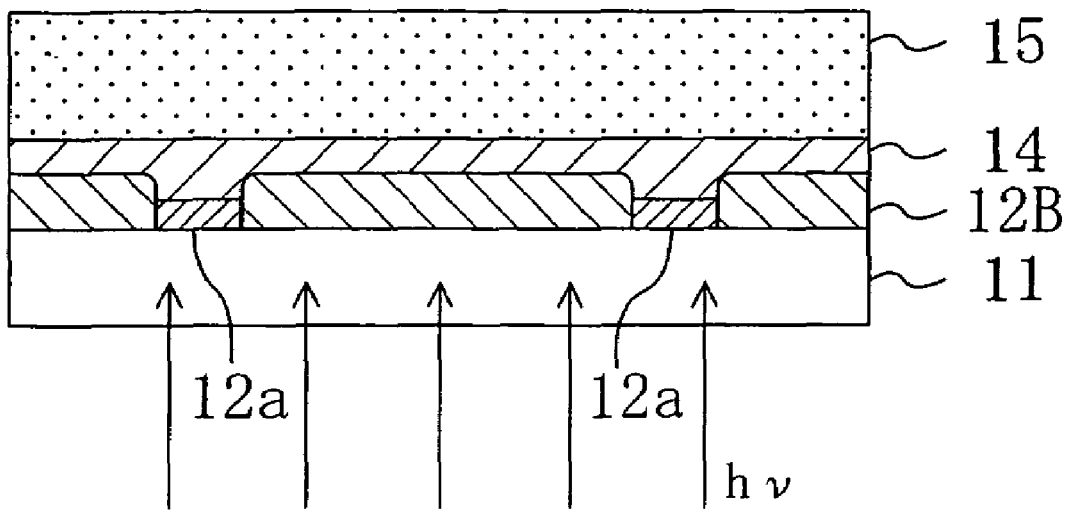
FIG. 5A and FIG. 5B are cross-sectional views sequentially illustrating steps in the method for manufacturing a semiconductor thin film according to the second embodiment of the present invention.
Figure 5B:
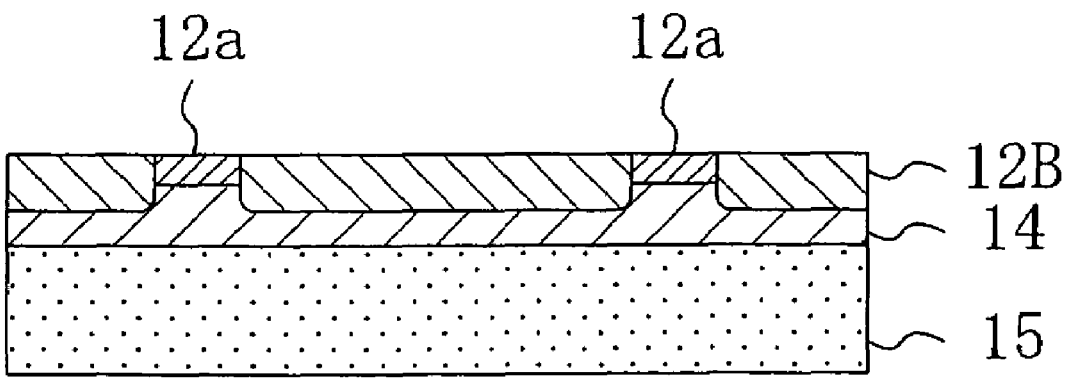

Next, as illustrated in FIG. 5A, one surface of the substrate 11 made of sapphire that is away from the base layer 12a is irradiated with krypton fluoride (KrF) excimer laser light having a wavelength of 248 nm so as to scan the entire surface of the substrate 11. Then, as illustrated in FIG. 5B, the radiated excimer laser light is not absorbed by the substrate 11 but is absorbed by the base layer 12a, whereby the base layer 12a is heated. This heat thermally decomposes gallium nitride, whereby the substrate 11 and the second semiconductor layer 14 including the support substrate 15 are separated from each other. Herein, the peak power density and the pulse width of the excimer laser light are set so that gallium nitride of the base layer 12a bound to the substrate 11 is thermally decomposed. Thus, by oscillating excimer laser light in a pulsed manner, the output power of the laser light can be increased significantly, whereby the substrate 11 can easily be separated from the second semiconductor layer 14. In addition, since the excimer laser light is radiated so as to scan the surface of the substrate 11, the substrate 11 can reliably be separated even if the substrate 11 has a relatively large area, irrespective of the beam diameter of the light source.

Moreover, in the second embodiment, after the growth of the second semiconductor layer 14, the substrate 11 is heated with a temperature of about 500° C. for the purpose of relieving the stress caused by the difference between the coefficient of thermal expansion of the second semiconductor layer 14 and that of the substrate 11. In this way, it is possible to prevent the occurrence of stress-induced cracks in the second semiconductor layer 14 when separating the substrate 11 with light irradiation.

Note that in a case where the separation between the oxidized regions 12B and the substrate 11 is insufficient, the oxidized regions 12B may be selectively removed by wet etching with an acidic aqueous solution including hydrogen fluoride (HF) or hydrogen chloride (HCl), or an alkaline aqueous solution including ammonia water ($NH_4OH$), either before or after the laser light irradiation.

As described above, in the second embodiment, as in the first embodiment, the crystal defect density of the second semiconductor layer 14, which laterally grows from the base layer 12a interposed between the oxidized regions 12B, is reduced, thereby significantly improving the crystallinity thereof. In addition, since the substrate 11 made of sapphire for forming the base layer 12a is separated and removed, the substrate 11 can be reused if the substrate 11 can be separated without a damage thereto, thereby allowing for a reduction in the cost of a device manufacturing process using the second semiconductor layer 14.

Moreover, when a semiconductor laser device is produced by bonding the support substrate 15 while choosing a material with a good heat radiating property therefor, the heat radiating property of the laser device is improved, whereby improvements in the operating characteristics of the laser device can be expected, such as an increase in the operating lifetime thereof.

Moreover, when an electrically conductive material is used for the support substrate 15, the positive electrode and the negative electrode of a semiconductor laser device, for example, can be formed so as to oppose each other via the support substrate 15 therebetween, whereby the chip size can be reduced.

Furthermore, when silicon or gallium arsenide (GaAs) that is oriented along the (001) plane is used for the support substrate 15, a desirable cleaved surface, i.e., a desirable cavity structure, can be formed with either material, thereby obtaining a desirable mirror characteristic in the active layer, and thus realizing improvements in the operating characteristics of a semiconductor laser device, such as a reduction in the threshold current thereof.

Alternatively, the substrate 11 may be separated by growing indium gallium nitride ($In_{0.1}Ga_{0.9}N$) whose forbidden band is equivalent to 3.0 eV, instead of using gallium nitride, for the first semiconductor layer 12A, and irradiating the reverse surface of the substrate 11 with the emission line of a mercury (Hg) lamp having a wavelength of 365 nm (a forbidden band equivalent to 3.4 eV), instead of using KrF excimer laser light, so as to scan the reverse surface of the substrate 11. Thus, when the emission line of a mercury lamp is used as the light source for irradiating the base layer 12a, although the output power thereof is lower than that of laser light, the spot diameter can be increased from that of laser light, whereby the substrate 11 can be separated within a shorter period of time.

Moreover, as in the first embodiment, silicon carbide, silicon, gallium arsenide, indium phosphide or gallium phosphide may be used for the substrate 11, instead of sapphire. Furthermore, lithium aluminum oxide, lithium gallium oxide, or a mixed crystal thereof, i.e., lithium gallium aluminum oxide ($LiGa_xAl_{1-x}O_2$ (where $0 \leqq x \leqq 1$)), may be used.

Third Embodiment

The third embodiment of the present invention will now be described with reference to the drawings.

FIG. 6A to FIG. 6E are cross-sectional views sequentially illustrating steps in a method for manufacturing a semiconductor thin film according to the third embodiment of the present invention.

Figure 6A:
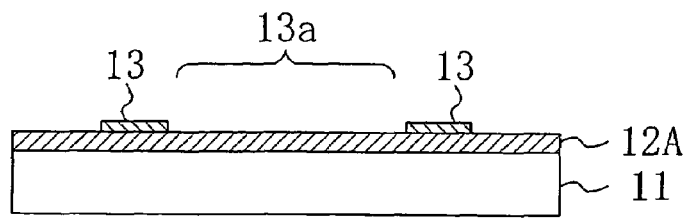
FIG. 6A to FIG. 6E are cross-sectional views sequentially illustrating steps in a method for manufacturing a semiconductor thin film according to a third embodiment of the present invention.

First, as illustrated in FIG. 6A, the first semiconductor layer 12A made of gallium nitride and having a thickness of about 1 μm is grown on the principal surface of the substrate 11 made of sapphire by an MOCVD method using trimethylgallium as a group III source and ammonia as a nitrogen source. Again, a low-temperature buffer layer may be provided between the substrate 11 and the first semiconductor layer 12A.

Then, a mask-forming film made of silicon and having a thickness of about 100 nm is deposited on the first semiconductor layer 12A by, for example, a CVD method in which monosilane is decomposed. Then, a resist pattern having a planar stripe pattern (not shown), for example, is formed on the mask-forming film by a photolithography method, and then the mask-forming film is dry-etched by an RIE method with a reactive gas containing hydrogen bromide or chlorine using the formed resist pattern as a mask, thereby forming, from the mask-forming film, the mask film 13 having a stripe pattern with the opening 13a therein. Then, the resist pattern is removed by ashing, or the like. Herein, an optical pattern exposure system capable of performing minute processing with a resolution of about 0.5 μm or better in terms of pattern width, such as a contact mask aligner or a g-ray stepper, is used. Note that while a stripe pattern is used as the planar shape of the mask film 13, it may alternatively be a dotted (island-like) pattern.

Figure 6B:
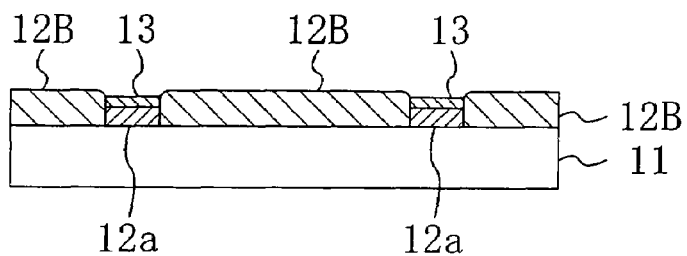

Next, as illustrated in FIG. 6B, the substrate 11 with the first semiconductor layer 12A and the mask film 13 formed thereon is subjected to a heat treatment at a temperature of 900° C. for about 4 hours, for example, in an oxygen gas or a water-vapor-containing atmosphere. Through the heat treatment, the plurality of oxidized regions 12B made of gallium oxide are formed through oxidization of the first semiconductor layer 12A in regions of the first semiconductor layer 12A that are not covered by the mask film 13. As a result, the base layer 12a made of gallium nitride is formed in each region of the first semiconductor layer 12A that is interposed by adjacent oxidized regions 12B. Herein, the oxidization of the oxidized regions 12B proceeds also in the direction parallel to the substrate surface (the lateral direction), whereby if the width dimension of the mask film 13 is set to be 0.5 μm in the patterning process, for example, the width dimension of the base layer 12a after the oxidization process can be as small as about 0.25 μm.

Figure 6C:
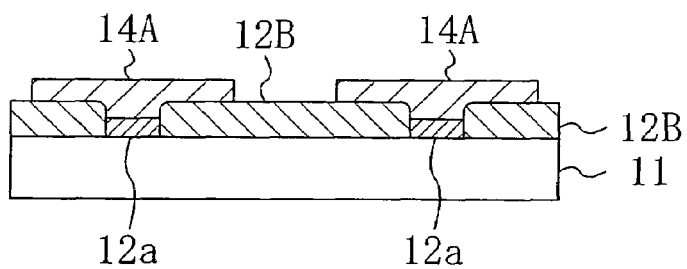

Next, as illustrated in FIG. 6C, the mask film 13 is removed by hydrofluoric-nitric acid or an RIE method, and then a second semiconductor layer 14A made of gallium nitride is selectively grown (through an ELO process) by an MOCVD method on the surface of the base layer 12a that is exposed between the plurality of oxidized regions 12B so as to leave an exposed portion in the central portion of the upper surface of each oxidized region 12B. Thus, the growth of the second semiconductor layers 14A, which are grown in an ELO process, is stopped before the opposing end surfaces of adjacent second semiconductor layers 14A that are growing toward each other come into contact with each other.

Figure 6D:
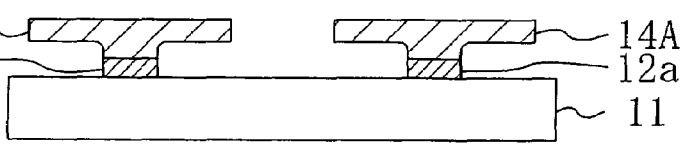

Next, as illustrated in FIG. 6D, the plurality of oxidized regions 12B are removed by an acidic aqueous solution such as hydrogen fluoride water or an alkaline aqueous solution such as ammonia water. Thus, each second semiconductor layer 14A has overhang side portions.

Figure 6E:
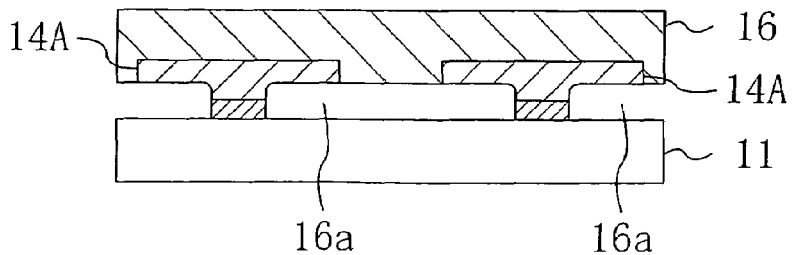

Next, as illustrated in FIG. 6E, a third semiconductor layer 16 made of gallium nitride is grown by an MOCVD method under growth conditions such that the ELO process with the second semiconductor layer 14A being the base crystal layer is dominant. In this process, a gap portion 16a is formed between the lower surface of the third semiconductor layer 16 and the principal surface of the substrate 11, whereby the third semiconductor layer 16 is grown without being influenced by either the surface of the oxidized regions 12B or the surface of the substrate 11. Again, an HVPE method may be used as the crystal growth method for the first semiconductor layer 12A, the second semiconductor layer 14A and the third semiconductor layer 16. Furthermore, an MBE method may be used for the first semiconductor layer 12A.

As described above, in the third embodiment, as in the first embodiment, the crystallinity of the second semiconductor layer 14A and that of the third semiconductor layer 16 are both improved by the ELO process proceeding from the base layer 12a having a reduced exposed area. Moreover, in the third embodiment, the third semiconductor layer 16 is grown on the substrate 11 so that the gap portion 16a obtained by removing the oxidized regions 12B is retained, whereby the growth of the third semiconductor layer 16 is not influenced by the surface of the substrate 11 or that of the oxidized regions 12B. As a result, the crystallinity of the third semiconductor layer 16 is improved as compared with a case where the oxidized regions 12B are not removed. In addition, the gap portion 16a also has an effect of reducing the stress in the third semiconductor layer 16 due to the lattice mismatch occurring while growing the third semiconductor layer 16.

Thus, the crystallinity of the third semiconductor layer 16 obtained by using the second semiconductor layer 14A as a new base layer can be further improved by removing the oxidized regions 12B obtained by oxidizing the first semiconductor layer 12A.

Note that as in the first embodiment, silicon carbide, silicon, gallium arsenide, indium phosphide or gallium phosphide may be used for the substrate 11, instead of sapphire. Furthermore, lithium aluminum oxide, lithium gallium oxide, or a mixed crystal thereof, i.e., lithium gallium aluminum oxide ($LiGa_xAl_{1-x}O_2$ (where $0 \leq x \leq 1$)), may be used.

Fourth Embodiment

The fourth embodiment of the present invention will now be described with reference to the drawings.

FIG. 7A to FIG. 7D and FIG. 8A and FIG. 8B are cross-sectional views sequentially illustrating steps in a method for manufacturing a semiconductor thin film according to the fourth embodiment of the present invention.

Figure 7A:
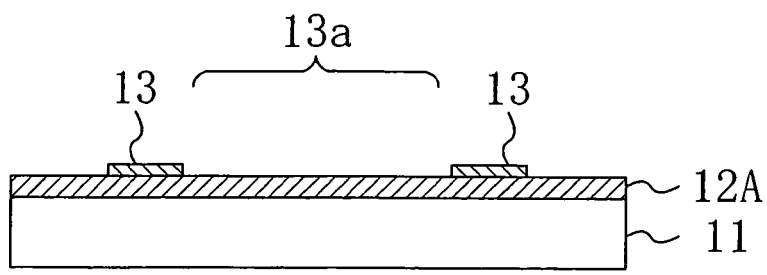
FIG. 7A to FIG. 7D are cross-sectional views sequentially illustrating steps in a method for manufacturing a semiconductor thin film according to a fourth embodiment of the present invention.

First, as illustrated in FIG. 7A, the first semiconductor layer 12A made of gallium nitride and having a thickness of about 1 µm is grown on the principal surface of the substrate 11 made of sapphire by an MOCVD method using trimethylgallium as a group III source and ammonia as a nitrogen source. Again, a low-temperature buffer layer may be provided between the substrate 11 and the first semiconductor layer 12A.

Then, a first mask-forming film made of silicon and having a thickness of about 100 nm is deposited on the first semiconductor layer 12A by, for example, a CVD method in which monosilane is decomposed. Then, a resist pattern having a planar stripe pattern (not shown), for example, is formed on the first mask-forming film by a photolithography method, and then the first mask-forming film is dry-etched by an RIE method with a reactive gas containing hydrogen bromide or chlorine using the formed resist pattern as a mask, thereby forming, from the first mask-forming film, the mask film 13 having a stripe pattern with the opening 13a therein. Then, the resist pattern is removed by ashing, or the like. Herein, an optical pattern exposure system capable of performing minute processing with a resolution of about 0.5 µm or better in terms of pattern width, such as a contact mask aligner or a g-ray stepper, is used. Note that while a stripe pattern is used as the planar shape of the first mask film 13, it may alternatively be a dotted (island-like) pattern.

Figure 7B:
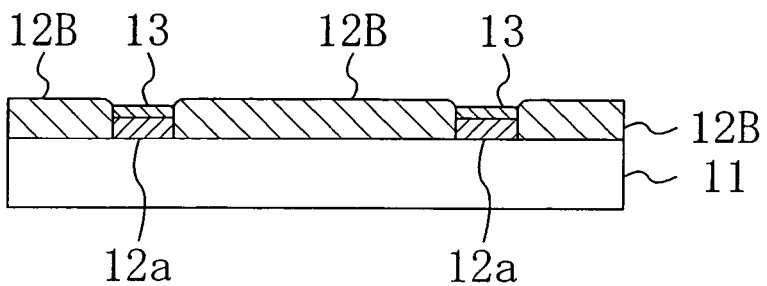

Next, as illustrated in FIG. 7B, the substrate 11 with the first semiconductor layer 12A and the first mask film 13 formed thereon is subjected to a heat treatment at a temperature of 900° C. for about 4 hours, for example, in an oxygen gas or a water-vapor-containing atmosphere. Through the heat treatment, the plurality of first oxidized regions 12B made of gallium oxide are formed through oxidization of the first semiconductor layer 12A in regions of the first semiconductor layer 12A that are not covered by the first mask film 13. As a result, the first base layer 12a made of gallium nitride is formed in each region of the first semiconductor layer 12A that is interposed by adjacent first oxidized regions 12B. Herein, the oxidization of the first oxidized regions 12B proceeds also in the direction parallel to the substrate surface (the lateral direction), whereby if the width dimension of the first mask film 13 is set to be 0.5 µm in the patterning process, for example, the width dimension of the first base layer 12a after the oxidization process can be as small as about 0.25 µm.

Figure 7C:
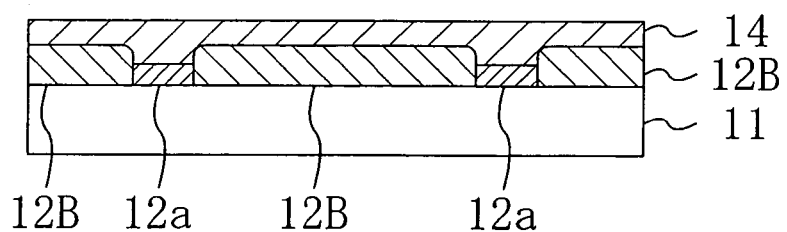

Next, as illustrated in FIG. 7C, the first mask film 13 is removed by hydrofluoric-nitric acid or an RIE method, and then the second semiconductor layer 14 made of gallium nitride is selectively grown (through an ELO process) by an MOCVD method on the surface of the first base layer 12a that is exposed between the plurality of first oxidized regions 12B so as to cover the first oxidized regions 12B.

Figure 7D:
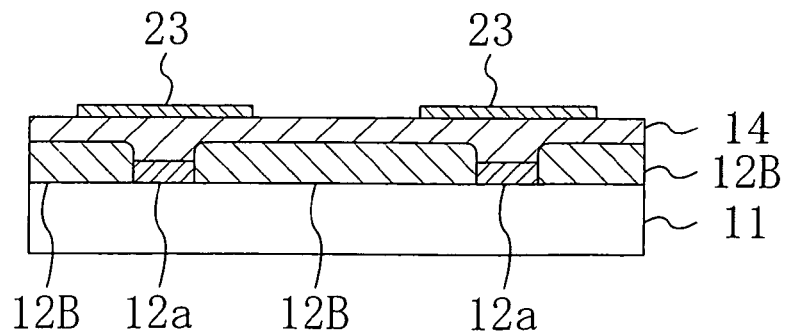

Next, as illustrated in FIG. 7D, a second mask film 23 made of silicon and having a thickness of about 100 nm is formed by a method similar to that for the first mask film 13 so that each second mask film 23 masks a portion of the second semiconductor layer 14 above the first base layer 12a and has an opening above the first oxidized region 12B.

Figure 8A:
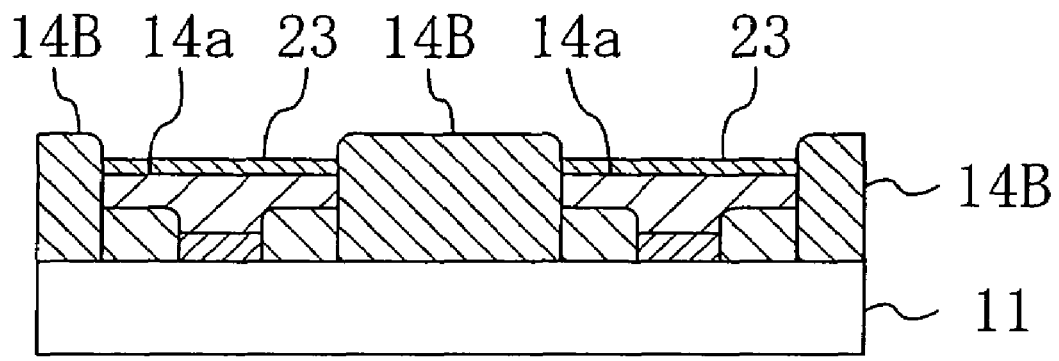
FIG. 8A and FIG. 8B are cross-sectional views sequentially illustrating steps in the method for manufacturing a semiconductor thin film according to the fourth embodiment of the present invention.

Next, as illustrated in FIG. 8A, the substrate 11 with the second semiconductor layer 14 and the second mask film 23 formed thereon is subjected to a heat treatment at a temperature of 900° C. for about 4 hours, for example, in an oxygen gas or a water-vapor-containing atmosphere. Through the heat treatment, a plurality of second oxidized regions 14B made of gallium oxide are formed through oxidization of the second semiconductor layer 14 in regions of the second semiconductor layer 14 that are not covered by the second mask film 23. As a result, a second base layer 14a made of gallium nitride is formed in each region of the second semiconductor layer 14 that is interposed by adjacent second oxidized regions 14B.

Figure 8B:
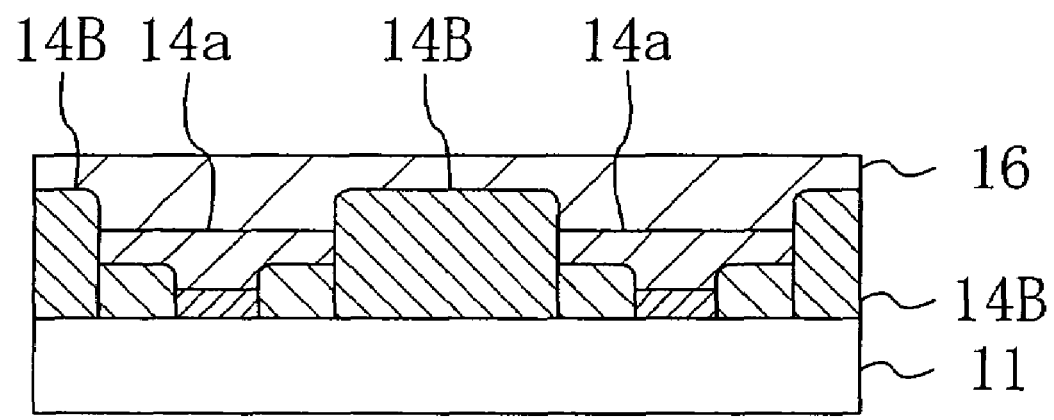

Next, as illustrated in FIG. 8B, the second mask film 23 is removed by hydrofluoric-nitric acid or an RIE method, and then the third semiconductor layer 16 made of gallium nitride is selectively grown (through an ELO process) by an MOCVD method on the surface of the second base layer 14a that is exposed between the plurality of second oxidized regions 14B so as to cover the second oxidized regions 12B.

Thus, in the fourth embodiment, the junction between ELO surfaces of the second semiconductor layer 14 is oxidized to form the second oxidized region 14B. At the junction between ELO surfaces, there is typically a shift in the crystal orientation, and the angle of the shift increases as the ELO distance, i.e., the width dimension of the second oxidized region 14B, increases.

In the fourth embodiment, the junction in the second semiconductor layer 14 in which the orientation is shifted is oxidized to form the second base layer 14a, and the ELO process is repeated using the second base layer 14a as a seed crystal, thereby reducing the orientation shift. As a result, the third semiconductor layer 16 growing from the second base layer 14a has an orientation with very little shift, whereby the crystallinity of the third semiconductor layer 16 is further improved as compared with that of the second semiconductor layer 14.

Note that also in the fourth embodiment, an HVPE method may be used as the crystal growth method for the first semiconductor layer 12A, the second semiconductor layer 14 and the third semiconductor layer 16. Furthermore, an MBE method may be used for the first semiconductor layer 12A.

Moreover, as in the first embodiment, silicon carbide, lithium aluminum oxide, silicon, gallium arsenide or indium phosphide may be used for the substrate 11, instead of sapphire.

Fifth Embodiment

The fifth embodiment of the present invention will now be described with reference to the drawings.

FIG. 9A to FIG. 9D and FIG. 10A to FIG. 10C are cross-sectional views sequentially illustrating steps in a method for manufacturing a semiconductor thin film according to the fifth embodiment of the present invention.

Figure 9A:
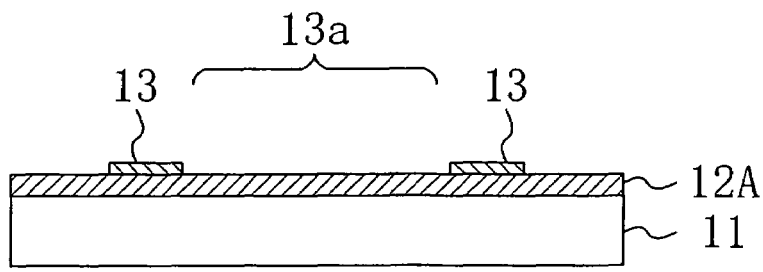
FIG. 9A to FIG. 9D are cross-sectional views sequentially illustrating steps in a method for manufacturing a semiconductor thin film according to a fifth embodiment of the present invention.

First, as illustrated in FIG. 9A, the first semiconductor layer 12A made of gallium nitride and having a thickness of about 1 μm is grown on the principal surface of the substrate 11 made of sapphire by an MOCVD method using trimethylgallium as a group III source and ammonia as a nitrogen source. Again, a low-temperature buffer layer may be provided between the substrate 11 and the first semiconductor layer 12A.

Then, a first mask-forming film made of silicon and having a thickness of about 100 nm is deposited on the first semiconductor layer 12A by, for example, a CVD method in which monosilane is decomposed. Then, a resist pattern having a planar stripe pattern (not shown), for example, is formed on the first mask-forming film by a photolithography method, and then the first mask-forming film is dry-etched by an RIE method with a reactive gas containing hydrogen bromide or chlorine using the formed resist pattern as a mask, thereby forming, from the first mask-forming film, the mask film 13 having a stripe pattern with the opening 13a therein. Then, the resist pattern is removed by ashing, or the like. Herein, an optical pattern exposure system capable of performing minute processing with a resolution of about 0.5 μm or better in terms of pattern width, such as a contact mask aligner or a g-ray stepper, is used. Note that while a stripe pattern is used as the planar shape of the first mask film 13, it may alternatively be a dotted (island-like) pattern.

Figure 9B:
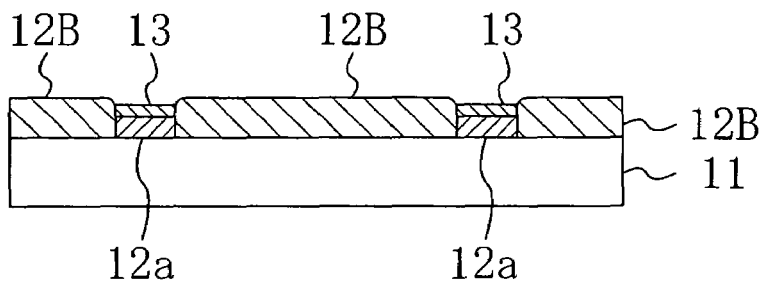

Next, as illustrated in FIG. 9B, the substrate 11 with the first semiconductor layer 12A and the first mask film 13 formed thereon is subjected to a heat treatment at a temperature of 900° C. for about 4 hours, for example, in an oxygen gas or a water-vapor-containing atmosphere. Through the heat treatment, the plurality of first oxidized regions 12B made of gallium oxide are formed through oxidization of the first semiconductor layer 12A in regions of the first semiconductor layer 12A that are not covered by the first mask film 13. As a result, the first base layer 12a made of gallium nitride is formed in each region of the first semiconductor layer 12A that is interposed by adjacent first oxidized regions 12B. Herein, the oxidization of the first oxidized regions 12B proceeds also in the direction parallel to the substrate surface (the lateral direction), whereby if the width dimension of the first mask film 13 is set to be 0.5 μm in the patterning process, for example, the width dimension of the first base layer 12a after the oxidization process can be as small as about 0.25 μm.

Figure 9C:
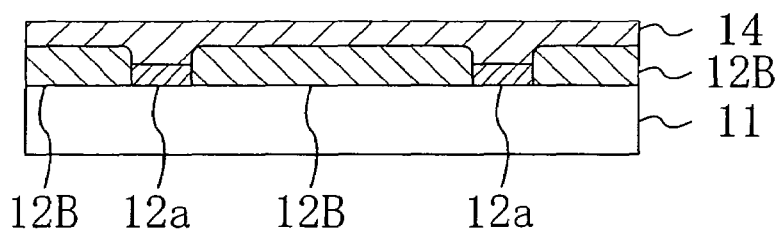

Next, as illustrated in FIG. 9C, the first mask film 13 is removed by hydrofluoric-nitric acid or an RIE method, and then the second semiconductor layer 14 made of gallium nitride is selectively grown (through an ELO process) by an MOCVD method on the surface of the first base layer 12a that is exposed between the plurality of first oxidized regions 12B so as to cover the first oxidized regions 12B.

Figure 9D:
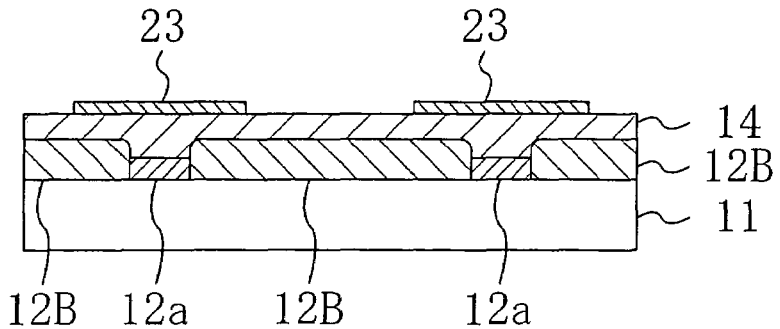

Next, as illustrated in FIG. 9D, a second mask film 23 made of silicon and having a thickness of about 100 nm is formed by a method similar to that for the first mask film 13 so that each second mask film 23 masks a portion of the second semiconductor layer 14 above the first base layer 12a and has an opening above the first oxidized region 12B.

Figure 10A:
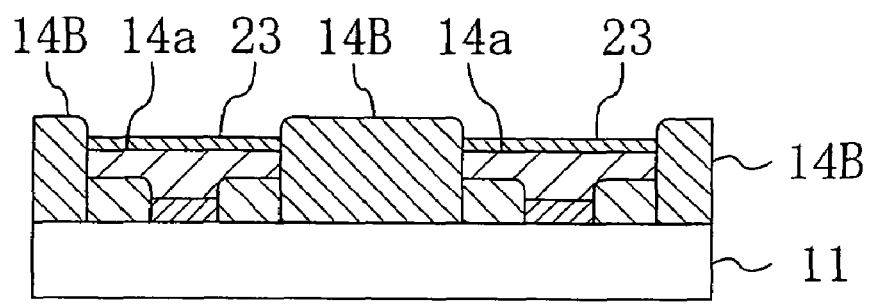
FIG. 10A to FIG. 10C are cross-sectional views sequentially illustrating steps in the method for manufacturing a semiconductor thin film according to the fifth embodiment of the present invention.

Next, as illustrated in FIG. 10A, the substrate 11 with the second semiconductor layer 14 and the second mask film 23 formed thereon is subjected to a heat treatment at a temperature of 900° C. for about 4 hours, for example, in an oxygen gas or a water-vapor-containing atmosphere. Through the heat treatment, the plurality of second oxidized regions 14B made of gallium oxide are formed through oxidization of the second semiconductor layer 14 in regions of the second semiconductor layer 14 that are not covered by the second mask film 23. As a result, the second base layer 14a made of gallium nitride is formed in each region of the second semiconductor layer 14 that is interposed by adjacent second oxidized regions 14B.

Figure 10B:
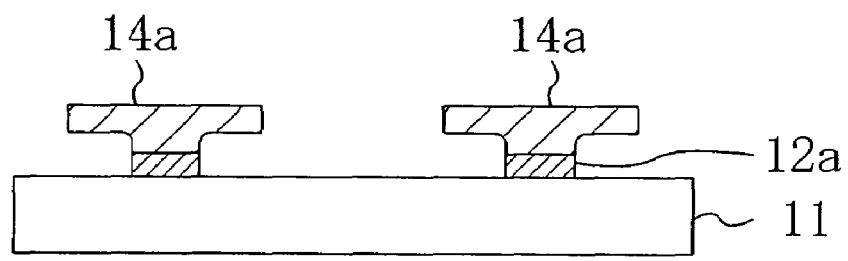

Next, as illustrated in FIG. 10B, the plurality of first oxidized regions 12B and the plurality of second oxidized regions 14B are removed by an acidic aqueous solution such as hydrogen fluoride water or an alkaline aqueous solution such as ammonia water. Thus, each second base layer 14a has overhang side portions.

Figure 10C:
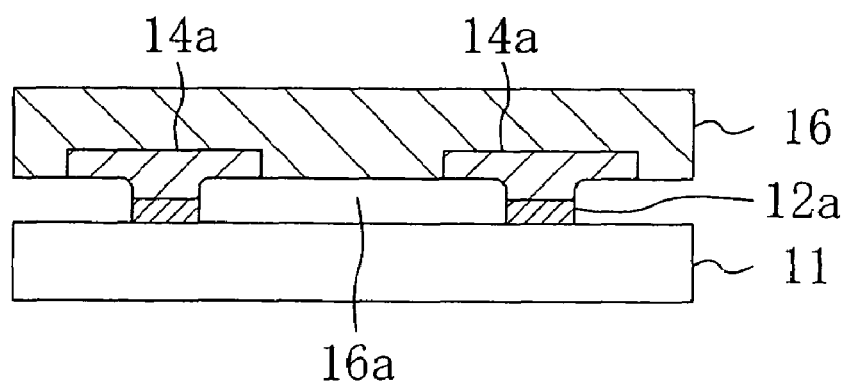

Next, as illustrated in FIG. 10C, the third semiconductor layer 16 made of gallium nitride is grown under growth conditions such that the ELO process with the second base layer 14a being a seed crystal is dominant. Thus, the gap portion 16a is formed between the lower surface of the third semiconductor layer 16 and the principal surface of the substrate 11, whereby the third semiconductor layer 16 is grown without being influenced by the surface of the second oxidized regions 14B. Again, an HVPE method may be used as the crystal growth method for the first semiconductor layer 12A, the second semiconductor layer 14 and the third semiconductor layer 16. Furthermore, an MBE method may be used for the first semiconductor layer 12A.

As described above, in the fifth embodiment, as in the fourth embodiment, the junction in the second semiconductor layer 14 in which the orientation is shifted through the ELO process is oxidized to form the second base layer 14a, and the ELO process is repeated using the second base layer 14a as a seed crystal, thereby reducing the orientation shift in the third semiconductor layer 16.

In addition, as in the third embodiment, the third semiconductor layer 16 is formed on the substrate 11 so that the gap portion 16a obtained by removing the oxidized regions 12B and the second oxidized regions 14B is retained, whereby the growth of the third semiconductor layer 16 is not influenced by the surface of the second oxidized regions 14B, thus further improving the crystallinity of the third semiconductor layer 16. In addition, the gap portion 16a reduces the stress in the third semiconductor layer 16 due to the lattice mismatch occurring while growing the third semiconductor layer 16.

Moreover, in the third embodiment, since the growth process of growing the second semiconductor layer 14A is stopped before the adjacent growth surfaces connect to each other, it is necessary to determine when to stop the growth process. In the fifth embodiment, the need to determine when to stop the growth process is eliminated, thereby simplifying the manufacturing process.

Note that as in the first embodiment, silicon carbide, silicon, gallium arsenide, indium phosphide or gallium phosphide may be used for the substrate 11, instead of sapphire.

Furthermore, lithium aluminum oxide, lithium gallium oxide, or a mixed crystal thereof, i.e., lithium gallium aluminum oxide ($LiGa_xAl_{1-x}O_2$ (where $0 \leq x \leq 1$)), may be used.

Sixth Embodiment

The sixth embodiment of the present invention will now be described with reference to the drawings.

FIG. 11A to FIG. 11D and FIG. 12A to FIG. 12C are cross-sectional views sequentially illustrating steps in a method for manufacturing a semiconductor thin film according to the sixth embodiment of the present invention.

Figure 11A:
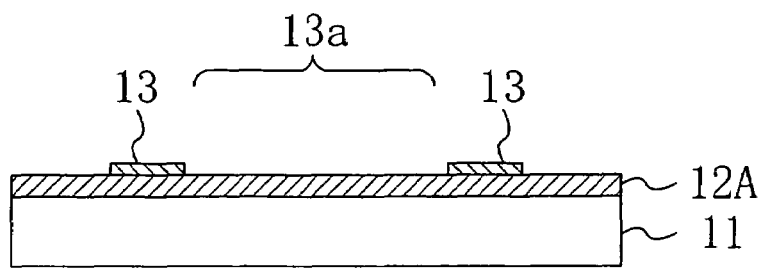
FIG. 11A to FIG. 11D are cross-sectional views sequentially illustrating steps in a method for manufacturing a semiconductor thin film according to a sixth embodiment of the present invention.

First, as illustrated in FIG. 11A, the first semiconductor layer 12A made of gallium nitride and having a thickness of about 1 µm is grown on the principal surface of the substrate 11 made of sapphire by an MOCVD method using trimethylgallium as a group III source and ammonia as a nitrogen source. Again, a low-temperature buffer layer may be provided between the substrate 11 and the first semiconductor layer 12A.

Then, a first mask-forming film made of silicon and having a thickness of about 100 nm is deposited on the first semiconductor layer 12A by, for example, a CVD method in which monosilane is decomposed. Then, a resist pattern having a planar stripe pattern (not shown), for example, is formed on the first mask-forming film by a photolithography method, and then the first mask-forming film is dry-etched by an RIE method with a reactive gas containing hydrogen bromide or chlorine using the formed resist pattern as a mask, thereby forming, from the first mask-forming film, the mask film 13 having a stripe pattern with the opening 13a therein. Then, the resist pattern is removed by ashing, or the like. Herein, an optical pattern exposure system capable of performing minute processing with a resolution of about 0.5 µm or better in terms of pattern width, such as a contact mask aligner or a g-ray stepper, is used. Note that while a stripe pattern is used as the planar shape of the first mask film 13, it may alternatively be a dotted (island-like) pattern.

Figure 11B:
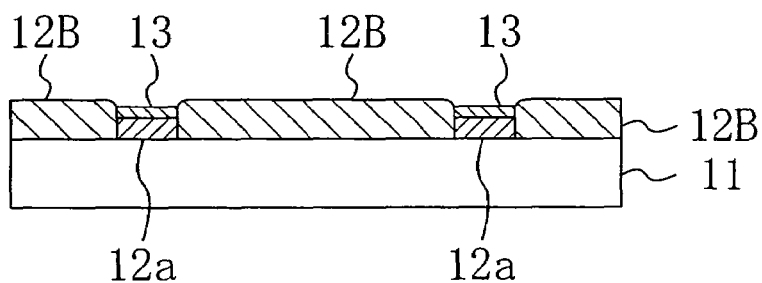

Next, as illustrated in FIG. 11B, the substrate 11 with the first semiconductor layer 12A and the first mask film 13 formed thereon is subjected to a heat treatment at a temperature of 900° C. for about 4 hours, for example, in an oxygen gas or a water-vapor-containing atmosphere. Through the heat treatment, the plurality of first oxidized regions 12B made of gallium oxide are formed through oxidization of the first semiconductor layer 12A in regions of the first semiconductor layer 12A that are not covered by the first mask film 13. As a result, the first base layer 12a made of gallium nitride is formed in each region of the first semiconductor layer 12A that is interposed by adjacent first oxidized regions 12B. Herein, the oxidization of the first oxidized regions 12B proceeds also in the direction parallel to the substrate surface (the lateral direction), whereby if the width dimension of the first mask film 13 is set to be 0.5 µm in the patterning process, for example, the width dimension of the first base layer 12a after the oxidization process can be as small as about 0.25 µm.

Figure 11C:
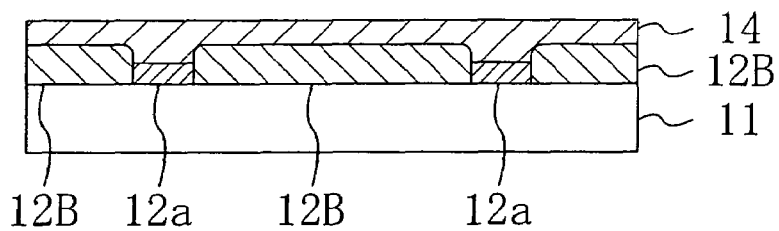
Figure 11D:
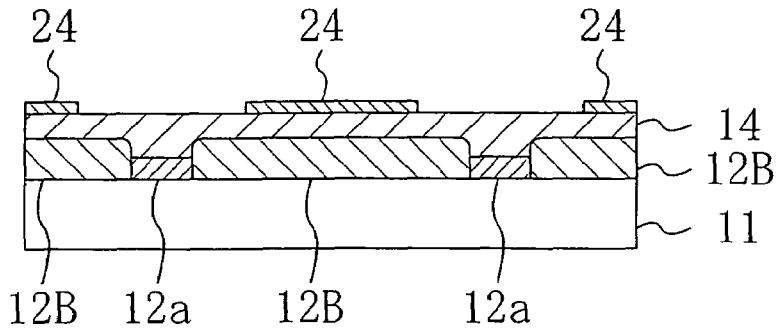

Next, as illustrated in FIG. 11C, the first mask film 13 is removed by hydrofluoric-nitric acid or an RIE method, and then the second semiconductor layer 14 made of gallium nitride is selectively grown (through an ELO process) by an MOCVD method on the surface of the first base layer 12a that is exposed between the plurality of first oxidized regions 12B so as to cover the first oxidized regions 12B.

Next, as illustrated in FIG. 1D, a second mask film 24 made of silicon and having a thickness of about 100 nm is formed by a method similar to that for the first mask film 13 so that the second mask film 24 has a plurality of openings for exposing therethrough portions of the second semiconductor layer 14 that are above the first base layers 12a.

Figure 12A:
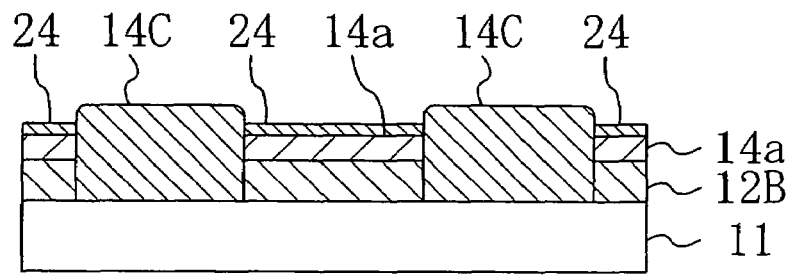
FIG. 12A to FIG. 12C are cross-sectional views sequentially illustrating steps in the method for manufacturing a semiconductor thin film according to the sixth embodiment of the present invention.

Next, as illustrated in FIG. 12A, the substrate 11 with the second semiconductor layer 14 and the second mask film 24 formed thereon is subjected to a heat treatment at a temperature of 900° C. for about 4 hours, for example, in an oxygen gas or a water-vapor-containing atmosphere. Through the heat treatment, a plurality of second oxidized regions 14C made of gallium oxide are formed through oxidization of the second semiconductor layer 14 in regions of the second semiconductor layer 14 that are not covered by the second mask film 24. As a result, the second base layer 14a made of gallium nitride is formed in each region of the second semiconductor layer 14 that is interposed by adjacent second oxidized regions 14C.

Figure 12B:
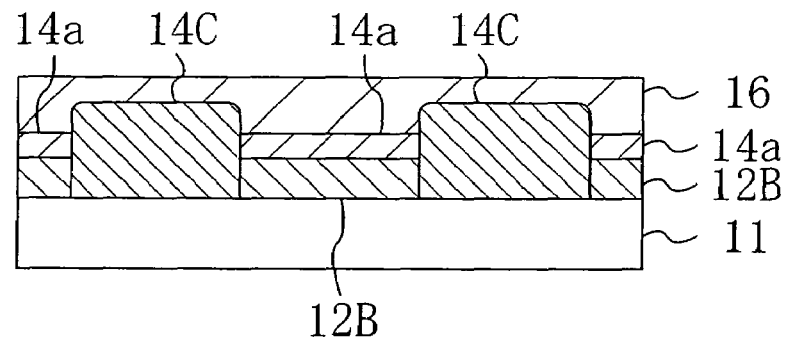

Next, as illustrated in FIG. 12B, the second mask film 24 is removed by hydrofluoric-nitric acid or an RIE method, and then the third semiconductor layer 16 made of gallium nitride is selectively grown (through an ELO process) by an MOCVD method on the surface of the second base layer 14a that is exposed between the plurality of second oxidized regions 14C so as to cover the second oxidized regions 14C.

Figure 12C:
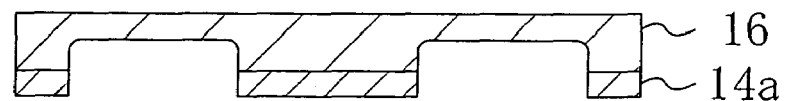

Next, as illustrated in FIG. 12C, the plurality of first oxidized regions 12B and the plurality of second oxidized regions 14C are removed by an acidic aqueous solution such as hydrogen fluoride water or an alkaline aqueous solution such as ammonia water. Thus, the substrate 11 and the third semiconductor layer 16 can be easily and uniformly separated from each other even if the substrate 11 has a relatively large area.

As described above, in the fourth or fifth embodiment, the second semiconductor layer 14 is processed to form the second oxidized regions 14B so as to leave the first base layer 12a. In the sixth embodiment, the second oxidized regions 14C are formed in regions between the first oxidized regions 12B in the second semiconductor layer 14. Thus, in the sixth embodiment, the first base layer 12a is taken over by the second oxidized region 14C, whereby the entire principal surface of the substrate 11 is covered by an oxide. Therefore, the third semiconductor layer 16 and the substrate 11 can be separated easily and reproducibly by wet etching even if the substrate 11 has a large area. As a result, the laser light irradiation process as illustrated in the second embodiment is no longer required in the step of separating the substrate 11, thereby eliminating the thermal damage from the irradiation with laser light. Furthermore, the manufacturing cost of the third semiconductor layer 16 itself can be reduced, and thus the cost of manufacturing a device using the third semiconductor layer 16 can be reduced.

In addition, by separating the substrate 11 for forming the first base layer 12a from the third semiconductor layer 16, the substrate 11 can be reused. Therefore, also by reusing the substrate 11, the cost of manufacturing a device can be further reduced.

Note that as in the first embodiment, silicon carbide, silicon, gallium arsenide, indium phosphide or gallium phosphide may be used for the substrate 11, instead of sapphire. Furthermore, lithium aluminum oxide, lithium gallium oxide, or a mixed crystal thereof, i.e., lithium gallium aluminum oxide ($LiGa_xAl_{1-x}O_2$ (where $0 \leq x \leq 1$)), may be used.

Seventh Embodiment

The seventh embodiment of the present invention will now be described with reference to the drawings.

FIG. 13A to FIG. 13D and FIG. 14A to FIG. 14D are cross-sectional views sequentially illustrating steps in a method for manufacturing a semiconductor thin film according to the seventh embodiment of the present invention.

Figure 13A:
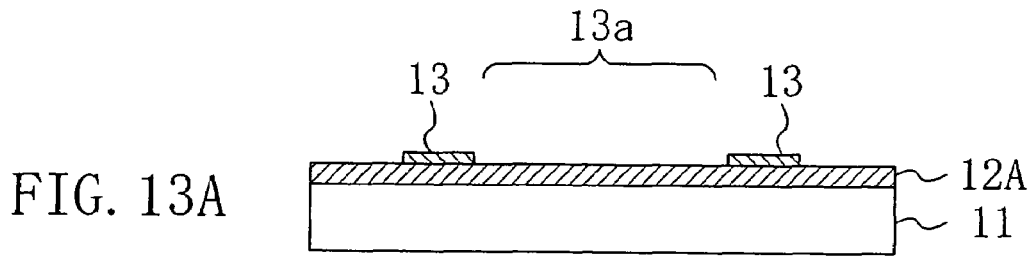
FIG. 13A to FIG. 13D are cross-sectional views sequentially illustrating steps in a method for manufacturing a semiconductor thin film according to a seventh embodiment of the present invention.

First, as illustrated in FIG. 13A, the first semiconductor layer 12A made of gallium nitride and having a thickness of about 1 µm is grown the principal surface of the substrate 11 made of sapphire by an MOCVD method using trimethylgallium as a group III source and ammonia as a nitrogen source. Again, a low-temperature buffer layer may be provided between the substrate 11 and the first semiconductor layer 12A.

Then, a first mask-forming film made of silicon and having a thickness of about 100 nm is deposited on the first semiconductor layer 12A by, for example, a CVD method in which monosilane is decomposed. Then, a resist pattern having a planar stripe pattern (not shown), for example, is formed on the first mask-forming film by a photolithography method, and then the first mask-forming film is dry-etched by an RIE method with a reactive gas containing hydrogen bromide or chlorine using the formed resist pattern as a mask, thereby forming, from the first mask-forming film, the mask film 13 having a stripe pattern with the opening 13a therein. Then, the resist pattern is removed by ashing, or the like. Herein, an optical pattern exposure system capable of performing minute processing with a resolution of about 0.5 µm or better in terms of pattern width, such as a contact mask aligner or a g-ray stepper, is used. Note that while a stripe pattern is used as the planar shape of the first mask film 13, it may alternatively be a dotted (island-like) pattern.

Figure 13B:
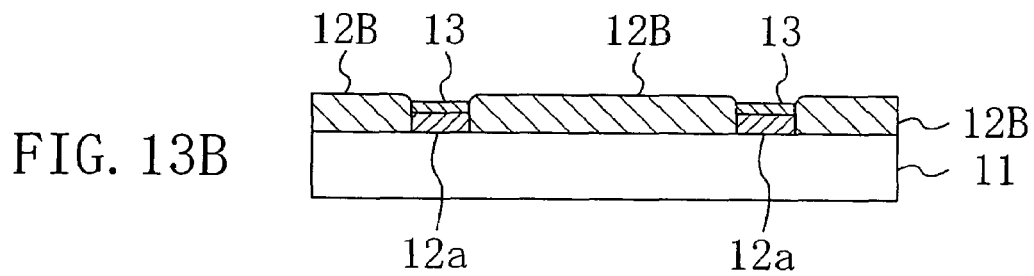

Next, as illustrated in FIG. 13B, the substrate 11 with the first semiconductor layer 12A and the first mask film 13 formed thereon is subjected to a heat treatment at a temperature of 900° C. for about 4 hours, for example, in an oxygen gas or a water-vapor-containing atmosphere. Through the heat treatment, the plurality of first oxidized regions 12B made of gallium oxide are formed through oxidization of the first semiconductor layer 12A in regions of the first semiconductor layer 12A that are not covered by the first mask film 13. As a result, the first base layer 12a made of gallium nitride is formed in each region of the first semiconductor layer 12A that is interposed by adjacent first oxidized regions 12B. Herein, the oxidization of the first oxidized regions 12B proceeds also in the direction parallel to the substrate surface (the lateral direction), whereby if the width dimension of the first mask film 13 is set to be 0.5 µm in the patterning process, for example, the width dimension of the first base layer 12a after the oxidization process can be as small as about 0.25 µm.

Figure 13C:
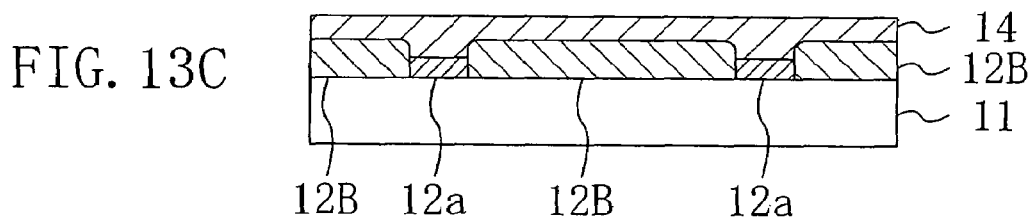

Next, as illustrated in FIG. 13C, the first mask film 13 is removed by hydrofluoric-nitric acid or an RIE method, and then the second semiconductor layer 14 made of gallium nitride is selectively grown (through an ELO process) by an MOCVD method on the surface of the first base layer 12a that is exposed between the plurality of first oxidized regions 12B so as to cover the first oxidized regions 12B.

Figure 13D:
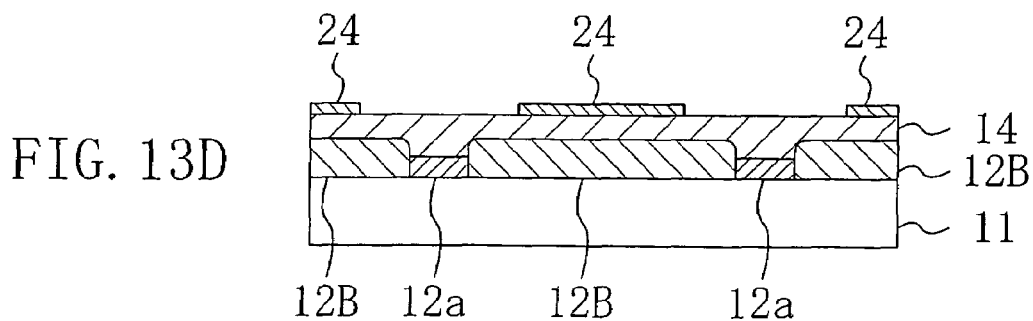

Next, as illustrated in FIG. 13D, the second mask film 24 made of silicon and having a thickness of about 100 nm is formed by a method similar to that for the first mask film 13 so that the second mask film 24 has a plurality of openings for exposing therethrough portions of the second semiconductor layer 14 that are above the first base layers 12a.

Figure 14A:
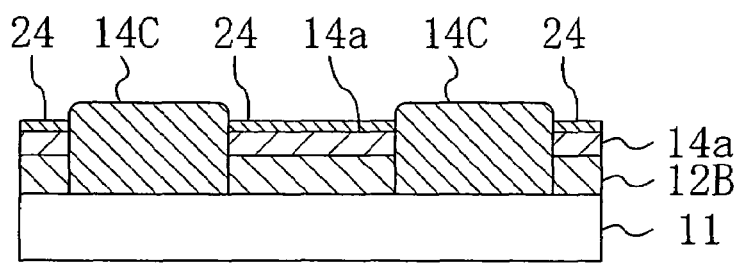
FIG. 14A to FIG. 14D are cross-sectional views sequentially illustrating steps in the method for manufacturing a semiconductor thin film according to the seventh embodiment of the present invention.

Next, as illustrated in FIG. 14A, the substrate 11 with the second semiconductor layer 14 and the second mask film 24 formed thereon is subjected to a heat treatment at a temperature of 900° C. for about 4 hours, for example, in an oxygen gas or a water-vapor-containing atmosphere. Through the heat treatment, the plurality of second oxidized regions 14C made of gallium oxide are formed through oxidization of the second semiconductor layer 14 in regions of the second semiconductor layer 14 that are not covered by the second mask film 24. As a result, a second base layer 14a made of gallium nitride is formed in each region of the second semiconductor layer 14 that is interposed by adjacent second oxidized regions 14C.

Figure 14B:
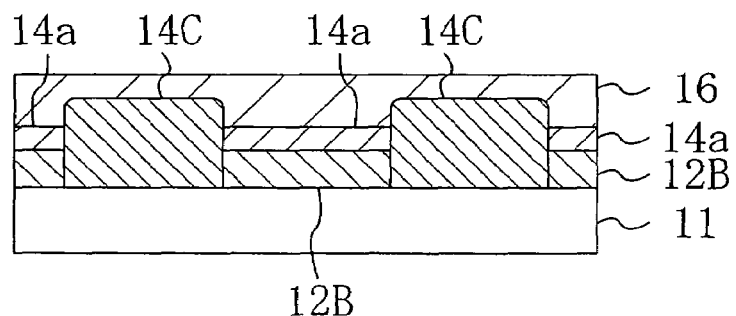

Next, as illustrated in FIG. 14B, the second mask film 24 is removed by hydrofluoric-nitric acid or an RIE method, and then the third semiconductor layer 16 made of gallium nitride is selectively grown (through an ELO process) by an MOCVD method on the surface of the second base layer 14a that is exposed between the plurality of second oxidized regions 14C so as to cover the second oxidized regions 14C.

Figure 14C:
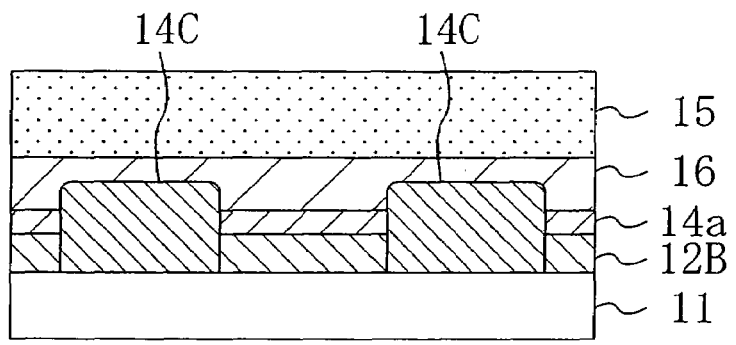

Next, as illustrated in FIG. 14C, the support substrate 15 made of silicon (Si) whose principal surface is oriented along the (100) plane is bonded to the upper surface of the third semiconductor layer 16 by a bonding method. Note that in a case where the thickness of the third semiconductor layer 16 can be sufficiently increased to be 100 µM or more, the support substrate 15 may not need to be bonded. Moreover, while silicon is used for the support substrate 15, gallium arsenide (GaAs) whose principal surface is oriented along the (100) plane, indium phosphide (InP), gallium phosphide (GaP) or a metal may alternatively be used.

Figure 14D:
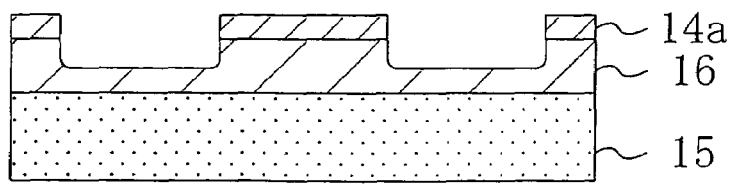

Next, as illustrated in FIG. 14D, the plurality of first oxidized regions 12B and the plurality of second oxidized regions 14C are removed by an acidic aqueous solution such as hydrogen fluoride water or an alkaline aqueous solution such as ammonia water. Thus, the substrate 11 and the third semiconductor layer 16 with the support substrate 15 bonded thereto can be easily and uniformly separated from each other even if the substrate 11 has a relatively large area.

As described above, in the seventh embodiment, the following effect can be obtained in addition to those of the sixth embodiment. Since the support substrate 15 made of silicon is bonded to the third semiconductor layer 16 with an improved crystallinity, when a semiconductor laser device is produced by using the third semiconductor layer 16, the support substrate 15 made of silicon that is oriented along the (001) plane can easily be cleaved. As a result, a desirable mirror characteristic in the active layer is obtained, thus realizing improvements in the operating characteristics of the semiconductor laser device, such as a reduction in the threshold current thereof.

Moreover, when the support substrate 15 is bonded while choosing a material with a good heat radiating property therefor, the heat radiating property of the semiconductor device is improved, whereby improvements in the operating characteristics of the device can be expected, such as an increase in the operating lifetime thereof Eighth Embodiment The eighth embodiment of the present invention will now be described with reference to the drawings.

Figure 15A:
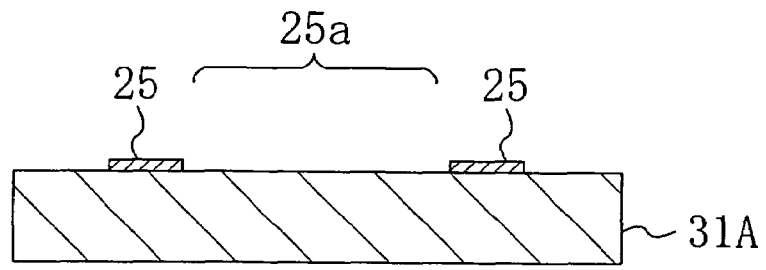
FIG. 15A to FIG. 15C are cross-sectional views sequentially illustrating steps in a method for manufacturing a semiconductor thin film according to an eighth embodiment of the present invention.
Figure 15B:
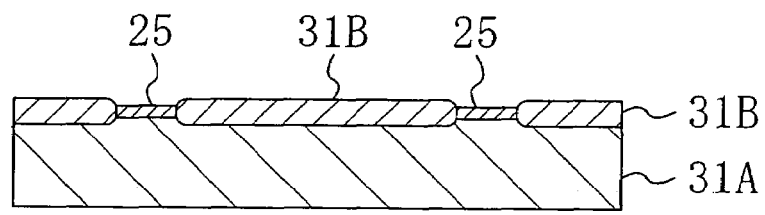
Figure 15C:
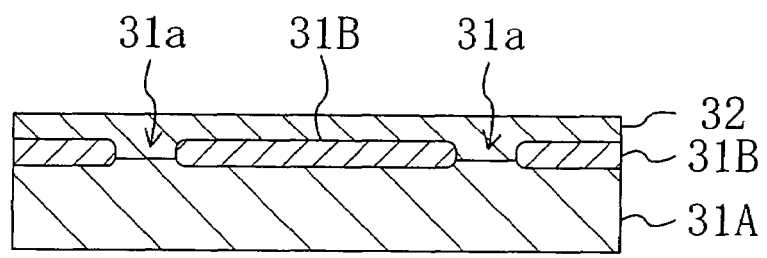

FIG. 15A to FIG. 15C are cross-sectional views sequentially illustrating steps in a method for manufacturing a semiconductor thin film according to the eighth embodiment of the present invention.

A feature of this and other subsequent embodiments is that the substrate on which a semiconductor layer is to be grown is made of a material such that an oxidized region for selective growth can be formed through oxidization of the substrate itself First, as illustrated in FIG. 15A, a mask-forming film made of silicon nitride ($Si_3N_4$) and having a thickness of about 100 nm is deposited on the principal surface of a substrate 31A made of silicon carbide (SiC) whose principal surface is oriented along the (0001) plane by, for example, a plasma CVD method. Then, a resist pattern having a planar stripe pattern (not shown), for example, is formed on the mask-forming film by a photolithography method, and then the mask-forming film is dry-etched by, for example, an RIE method with a reactive gas containing fluorocarbon using the formed resist pattern as a mask, thereby forming, from the mask-forming film, a mask film 25 having a stripe pattern with an opening 25a therein. Then, the resist pattern is removed by ashing, or the like. Herein, an optical pattern exposure system capable of performing minute processing with a resolution of about 0.5 μm or better in terms of pattern width, such as a contact mask aligner apparatus or a g-ray stepper, is used. Note that while a stripe pattern is used as the planar shape of the mask film 25, it may alternatively be a dotted (island-like) pattern.

Next, as illustrated in FIG. 15B, the substrate 31A with the mask film 25 formed thereon is subjected to a heat treatment at a temperature of 1000° C. for about 5 hours, for example, in an oxygen gas or a water-vapor-containing atmosphere. Through the heat treatment, a plurality of oxidized regions 31B made of silicon oxide ($SiO_2$) are formed through oxidization of the substrate 31A in regions of the substrate 31A that are not covered by the mask film 25. As a result, a base region 31a is formed in each region in the upper portion of the substrate 31A that is interposed by adjacent oxidized regions 31B. Herein, the oxidization of the oxidized regions 31B proceeds also in the direction parallel to the substrate surface (the lateral direction), whereby if the width dimension of the mask film 25 is set to be 0.5 μm in the patterning process, for example, the width dimension of the base region 31a after the oxidization process can be as small as about 0.25 μm. Moreover, since an oxygen gas or a water-vapor-containing atmosphere is used as an oxidizing atmosphere for selectively oxidizing the oxidized regions 31B, a quick and uniform oxidization process can be performed reproducibly.

Note that the (0001) plane of silicon carbide, which is the orientation thereof, typically has two polarities called the "Si plane" and the "C plane", and the oxidization rate of the C plane is higher than that of the Si plane. Therefore, while the C plane is preferred in order to reduce the process time, it is preferred that the orientation of the principal surface of the substrate 31A is determined in view of the crystallinity of the silicon carbide layer to be grown on the substrate 31A.

Next, as illustrated in FIG. 15C, the mask film 25 is removed by an RIE method, for example, and then a semiconductor layer 32 made of silicon carbide is selectively grown (through an ELO process) on the surface of the base region 31a that is exposed between the plurality of oxidized regions 31B in the substrate 31A so as to cover the oxidized regions 31B by a CVD method in which monosilane ($SiH_4$) and ethylene ($C_2H_4$) are reacted with each other under conditions such that the lateral growth is dominant.

Thus, in the eighth embodiment, as in the first embodiment, when the semiconductor layer 32 is grown, the lateral growth is dominant above the oxidized regions 31B, whereby the semiconductor layer 32 is not influenced by the surface of the substrate 31A to be the base thereof above the oxidized regions 31B, thus reducing the crystal defect density of the semiconductor layer 32.

In addition, the opening size of the base region 31a made of silicon carbide can be made smaller than the width dimension of the mask film 25. Therefore, if the mask film 25 is patterned by using a pattern exposure system whose resolution is on the 0.1 μm level, the width dimension of the base region 31a can be further reduced, whereby the crystallinity of the semiconductor layer 32 to be re-grown is even less likely to be influenced by the surface of the base region 31a.

Note that while silicon carbide (SiC) is used for the single-crystal substrate 31A, silicon (Si), gallium arsenide (GaAs), indium phosphide (InP) or gallium phosphide (GaP) may alternatively be used instead of silicon carbide.

Alternatively, a support substrate made of silicon or the like may be bonded to the upper surface of the semiconductor layer 32, which is the semiconductor thin film of interest, and then the substrate 31A may be removed from the semiconductor layer 32 by a polishing method, or the like.

Ninth Embodiment

The ninth embodiment of the present invention will now be described with reference to the drawings.

FIG. 16A to FIG. 16D and FIG. 17A to FIG. 17C are cross-sectional views sequentially illustrating steps in a method for manufacturing a semiconductor thin film according to the ninth embodiment of the present invention.

Figure 16A:
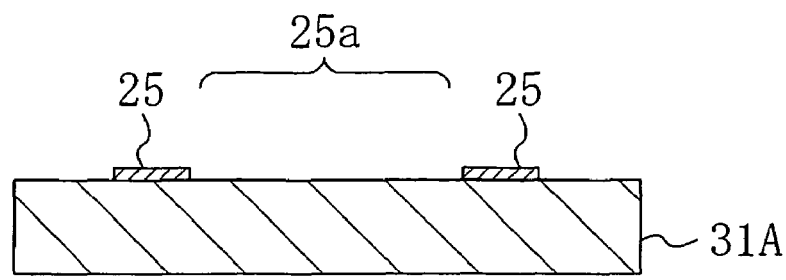
FIG. 16A to FIG. 16D are cross-sectional views sequentially illustrating steps in a method for manufacturing a semiconductor thin film according to a ninth embodiment of the present invention.

First, as illustrated in FIG. 16A, a first mask-forming film made of silicon nitride and having a thickness of about 100 nm is deposited on the principal surface of the substrate 31A made of silicon carbide whose principal surface is oriented along the (0001) plane by, for example, a plasma CVD method. Then, a resist pattern having a planar stripe pattern (not shown), for example, is formed on the first mask-forming film by a photolithography method, and then the first mask-forming film is dry-etched by, for example, an RIE method with a reactive gas containing fluorocarbon using the formed resist pattern as a mask, thereby forming, from the first mask-forming film, the first mask film 25 having a stripe pattern with the opening 25a therein. Then, the resist pattern is removed by ashing, or the like. Herein, an optical pattern exposure system capable of performing minute processing with a resolution of about 0.5 μm or better in terms of pattern width, such as a contact mask aligner apparatus or a g-ray stepper, is used. Note that while a stripe pattern is used as the planar shape of the first mask film 25, it may alternatively be a dotted (island-like) pattern.

Figure 16B:
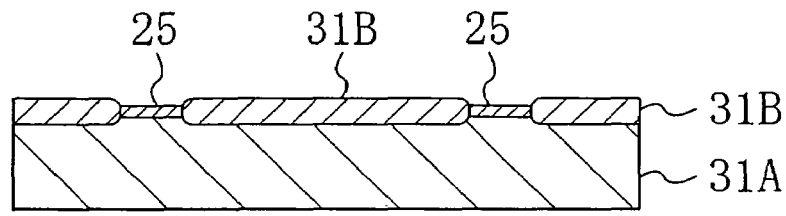

Next, as illustrated in FIG. 16B, the substrate 31A with the first mask film 25 formed thereon is subjected to a heat treatment at a temperature of 1000° C., for example, in an oxygen gas or a water-vapor-containing atmosphere. Through the heat treatment, the plurality of first oxidized regions 31B made of silicon oxide are formed through oxidization of the substrate 31A in regions of the substrate 31A that are not covered by the first mask film 25. As a result, the base region 31a is formed in each region in the upper portion of the substrate 31A that is interposed by adjacent first oxidized regions 31B. Herein, the oxidization of the first oxidized regions 31B proceeds also in the direction parallel to the substrate surface (the lateral direction), whereby if the width dimension of the first mask film 25 is set to be 0.5 μm in the patterning process, for example, the width dimension of the base region 31a after the oxidization process can be as small as about 0.25 μm. Moreover, since an oxygen gas or a water-vapor-containing atmosphere is used as an oxidizing atmosphere for selectively oxidizing the first oxidized regions 31B, a quick and uniform oxidization process can be performed reproducibly.

Figure 16C:
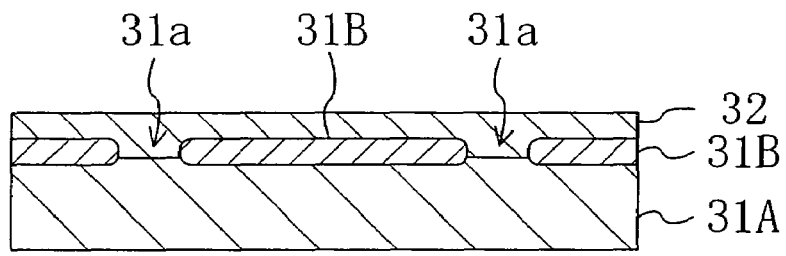

Next, as illustrated in FIG. 16C, the first mask film 25 is removed by an RE method, for example, and then the first semiconductor layer 32 made of silicon carbide is selectively grown (through an ELO process) on the surface of the base region 31a that is exposed between the plurality of first oxidized regions 31B in the substrate 31A so as to cover the first oxidized regions 31B by a CVD method under conditions such that the lateral growth is dominant.

Figure 16D:
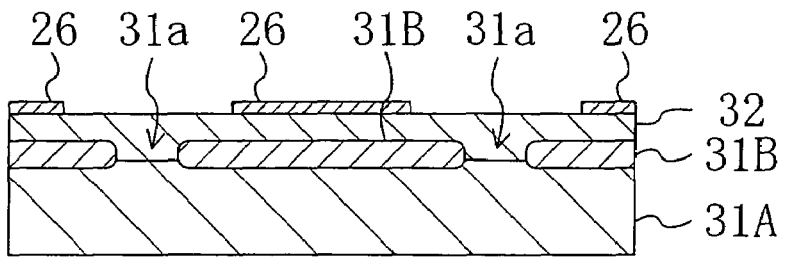

Next, as illustrated in FIG. 16D, a second mask film 26 made of silicon nitride and having a thickness of about 100 nm is formed by a method similar to that for the first mask film 25 so that the second mask film 26 has a plurality of openings for exposing therethrough portions of the first semiconductor layer 32 that are above the base regions 31a.

Figure 17A:
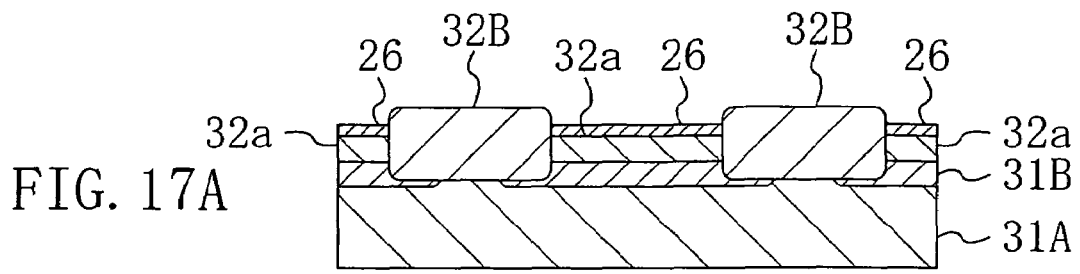
FIG. 17A to FIG. 17C are cross-sectional views sequentially illustrating steps in the method for manufacturing a semiconductor thin film according to the ninth embodiment of the present invention.

Next, as illustrated in FIG. 17A, the substrate 31A with the first semiconductor layer 32 and the second mask film 26 formed thereon is subjected to a heat treatment at a temperature of 1000° C., for example, in an oxygen gas or a water-vapor-containing atmosphere. Through the heat treatment, a plurality of second oxidized regions 32B made of silicon oxide are formed through oxidization of the first semiconductor layer 32 in regions of the first semiconductor layer 32 that are not covered by the second mask film 26. As a result, a base layer 32a made of silicon carbide is formed in each region in the first semiconductor layer 32 that is interposed by adjacent second oxidized regions 32B. Herein, the base region 31a is taken over by the second oxidized region 32B, whereby the entire principal surface of the substrate 31A is covered by silicon oxide.

Figure 17B:
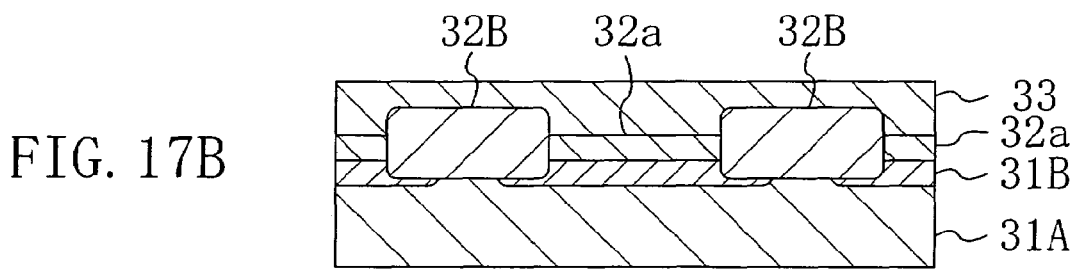

Next, as illustrated in FIG. 17B, the second mask film 26 is removed by an RIE method, and then a second semiconductor layer 33 made of silicon carbide is selectively grown (through an ELO process) by a CVD method on the surface of the base layer 32a that is exposed between the plurality of second oxidized regions 32B so as to cover the second oxidized regions 32B.

Figure 17C:
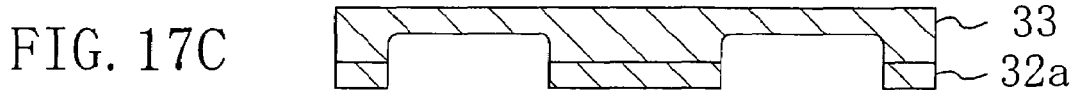

Next, as illustrated in FIG. 17C, the plurality of first oxidized regions 31B and the plurality of second oxidized regions 32B are removed by an acidic aqueous solution such as hydrogen fluoride water. Thus, the substrate 31A and the second semiconductor layer 33 can be reproducibly and easily separated from each other even if the substrate 31A has a large area.

Thus, in the ninth embodiment, the following effect can be obtained in addition to those of the eighth embodiment. By separating the substrate 31A for forming the base region 31a and the base layer 32a from the second semiconductor layer 33, the substrate 31A can be reused. In this way, since the substrate 31A made of silicon carbide is typically expensive, it is possible to reduce the manufacturing cost for manufacturing a device using the second semiconductor layer 33 by reusing the substrate 31A.

Note that while silicon carbide (SiC) is used for the single-crystal substrate 31A, silicon (Si), gallium arsenide (GaAs), indium phosphide (InP) or gallium phosphide (GaP) may alternatively be used instead of silicon carbide.

Tenth Embodiment

The tenth embodiment of the present invention will now be described with reference to the drawings.

FIG. 18A to FIG. 18D and FIG. 19A and FIG. 19B are cross-sectional views sequentially illustrating steps in a method for manufacturing a semiconductor thin film according to the tenth embodiment of the present invention.

Figure 18A:
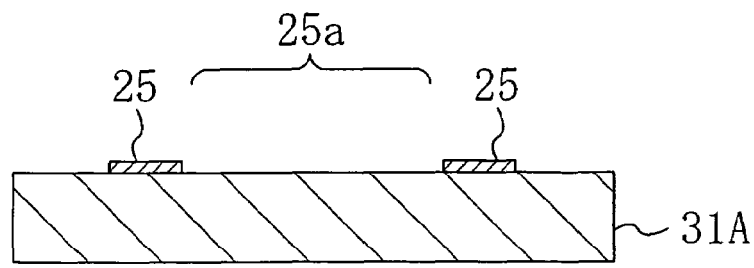
FIG. 18A to FIG. 18D are cross-sectional views sequentially illustrating steps in a method for manufacturing a semiconductor thin film according to a tenth embodiment of the present invention.

First, as illustrated in FIG. 18A, a first mask-forming film made of silicon nitride and having a thickness of about 100 nm is deposited on the principal surface of the substrate 31A made of silicon carbide whose principal surface is oriented along the (0001) plane by, for example, a plasma CVD method. Then, a resist pattern having a planar stripe pattern (not shown), is formed on the first mask-forming film by a photolithography method, and then the first mask-forming film is dry-etched by, for example, an RIE method with a reactive gas containing fluorocarbon using the formed resist pattern as a mask, thereby forming, from the first mask-forming film, the first mask film 25 having a stripe pattern with the opening 25a therein. Then, the resist pattern is removed by ashing, or the like. Herein, an optical pattern exposure system capable of performing minute processing with a resolution of about 0.5 μm or better in terms of pattern width, such as a contact mask aligner apparatus or a g-ray stepper, is used. Note that while a stripe pattern is used as the planar shape of the first mask film 25, it may alternatively be a dotted (island-like) pattern.

Figure 18B:
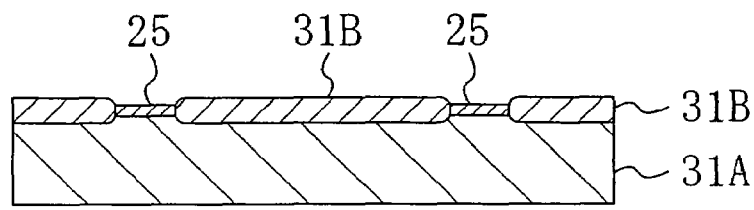

Next, as illustrated in FIG. 18B, the substrate 31A with the first mask film 25 formed thereon is subjected to a heat treatment at a temperature of 1000° C., for example, in an oxygen gas or a water-vapor-containing atmosphere. Through the heat treatment, the plurality of first oxidized regions 31B made of silicon oxide are formed through oxidization of the substrate 31A in regions of the substrate 31A that are not covered by the first mask film 25. As a result, the base region 31a is formed in each region in the upper portion of the substrate 31A that is interposed by adjacent first oxidized regions 31B. Herein, the oxidization of the first oxidized regions 31B proceeds also in the direction parallel to the substrate surface (the lateral direction), whereby if the width dimension of the first mask film 25 is set to be 0.5 μm in the patterning process, for example, the width dimension of the base region 31a after the oxidization process can be as small as about 0.25 μm. Moreover, since an oxygen gas or a water-vapor-containing atmosphere is used as an oxidizing atmosphere for selectively oxidizing the first oxidized regions 31B, a quick and uniform oxidization process can be performed reproducibly.

Figure 18C:
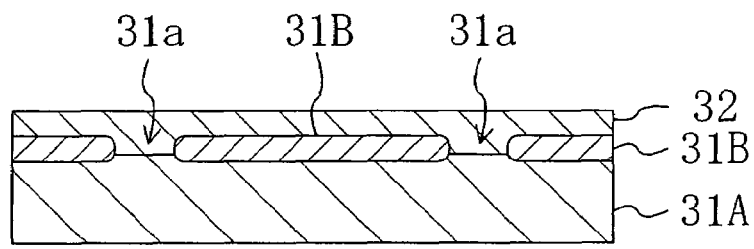

Next, as illustrated in FIG. 18C, the first mask film 25 is removed by an RIE method, for example, and then the first semiconductor layer 32 made of silicon carbide is selectively grown (through an ELO process) on the surface of the base region 31a that is exposed between the plurality of first oxidized regions 31B in the substrate 31A so as to cover the first oxidized regions 31B by a CVD method under conditions such that the lateral growth is dominant.

Figure 18D:
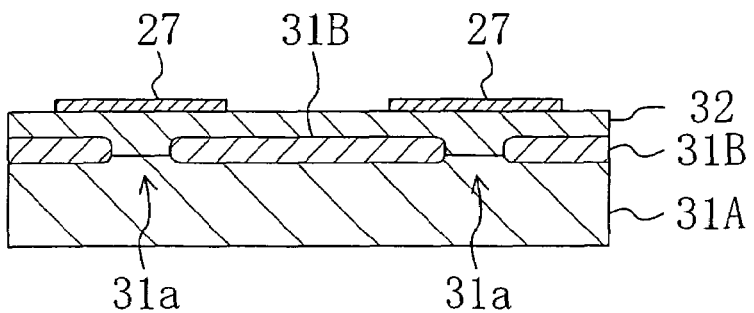

Next, as illustrated in FIG. 18D, a second mask film 27 made of silicon nitride and having a thickness of about 100 nm is formed by a method similar to that for the first mask film 25 so that each second mask film 27 masks a portion of the first semiconductor layer 32 above the base region 31a and has an opening above the first oxidized region 31B.

Figure 19A:
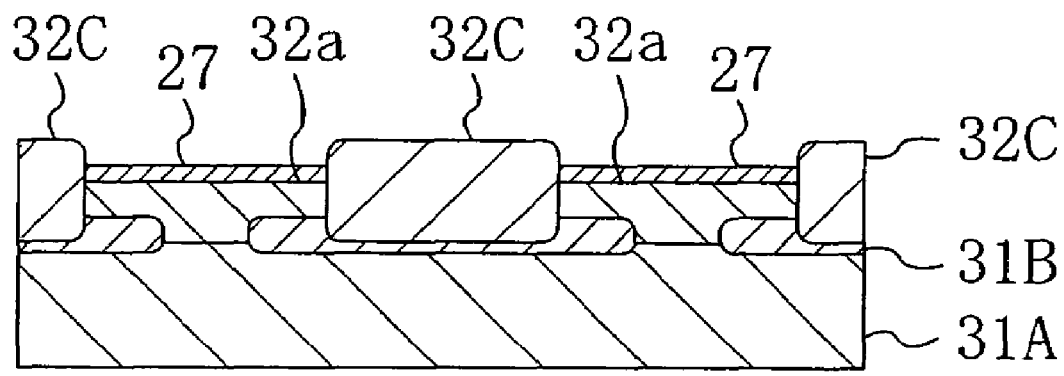
FIG. 19A and FIG. 19B are cross-sectional views sequentially illustrating steps in the method for manufacturing a semiconductor thin film according to the tenth embodiment of the present invention.

Next, as illustrated in FIG. 19A, the substrate 31A with the first semiconductor layer 32 and the second mask film 27 formed thereon is subjected to a heat treatment at a temperature of 1000° C., for example, in an oxygen gas or a water-vapor-containing atmosphere. Through the heat treatment, a plurality of second oxidized regions 32C made of silicon oxide are formed through oxidization of the first semiconductor layer 32 in regions of the first semiconductor layer 32 that are not covered by the second mask film 27. As a result, the base layer 32a made of silicon carbide is formed in each region in the first semiconductor layer 32 that is interposed by adjacent second oxidized regions 32C.

Figure 19B:
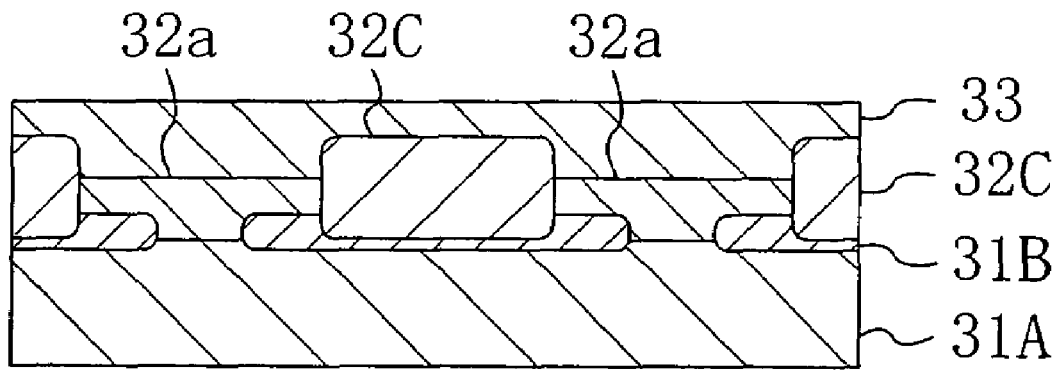

Next, as illustrated in FIG. 19B, the second mask film 27 is removed by an RIE method, and then a second semiconductor layer 33 made of silicon carbide is selectively grown (through an ELO process) by a CVD method on the surface of the base layer 32a that is exposed between the plurality of second oxidized regions 32C so as to cover the second oxidized regions 32C.

Thus, in the tenth embodiment, the junction in the first semiconductor layer 32 in which the orientation is shifted is oxidized to form the new base layer 32a from the first semiconductor layer 32, and the ELO process is repeated using the formed base layer 32a as a seed crystal, thereby reducing the orientation shift. As a result, the second semiconductor layer 33 growing from the base layer 32a has an orientation with very little shift, whereby the crystallinity of the second semiconductor layer 33 is further improved as compared with that of the first semiconductor layer 32.

Note that while silicon carbide (SiC) is used for the single-crystal substrate 31A, silicon (Si), gallium arsenide (GaAs), indium phosphide (InP) or gallium phosphide (GaP) may alternatively be used instead of silicon carbide.

Eleventh Embodiment

The eleventh embodiment of the present invention will now be described with reference to the drawings.

FIG. 20A to FIG. 20D and FIG. 21A to FIG. 21C are cross-sectional views sequentially illustrating steps in a method for manufacturing a semiconductor thin film according to the eleventh embodiment of the present invention.

Figure 20A:
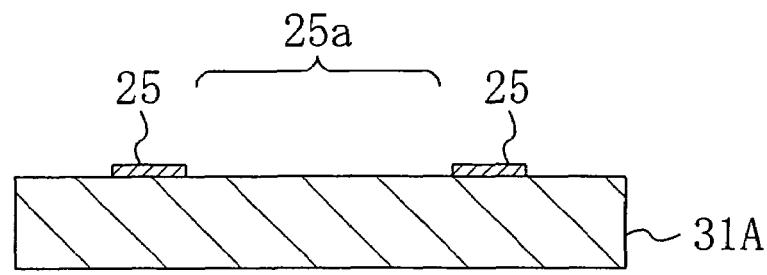
FIG. 20A to FIG. 20D are cross-sectional views sequentially illustrating steps in a method for manufacturing a semiconductor thin film according to an eleventh embodiment of the present invention.

First, as illustrated in FIG. 20A, a first mask-forming film made of silicon nitride and having a thickness of about 100 nm is deposited on the principal surface of the substrate 31A made of silicon carbide whose principal surface is oriented along the (0001) plane by, for example, a plasma CVD method. Then, a resist pattern having a planar stripe pattern (not shown), for example, is formed on the first mask-forming film by a photolithography method, and then the first mask-forming film is dry-etched by, for example, an RIE method with a reactive gas containing fluorocarbon using the formed resist pattern as a mask, thereby forming, from the first mask-forming film, the first mask film 25 having a stripe pattern with the opening 25a therein. Then, the resist pattern is removed by ashing, or the like. Herein, an optical pattern exposure system capable of minute processing with a resolution 0.5 μm or less, such as a contact mask aligner apparatus or a g-ray stepper, is used. Note that while a stripe pattern is used as the planar shape of the first mask film 25, it may alternatively be a dotted (island-like) pattern.

Figure 20B:
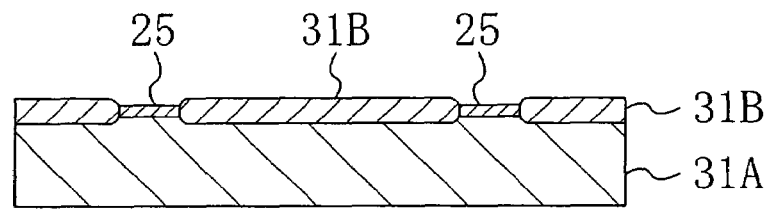

Next, as illustrated in FIG. 20B, the substrate 31A with the first mask film 25 formed thereon is subjected to a heat treatment at a temperature of 1000° C., for example, in an oxygen gas or a water-vapor-containing atmosphere. Through the heat treatment, the plurality of first oxidized regions 31B made of silicon oxide are formed through oxidization of the substrate 31A in regions of the substrate 31A that are not covered by the first mask film 25. As a result, the base region 31a is formed in each region in the upper portion of the substrate 31A that is interposed by adjacent first oxidized regions 31B. Herein, the oxidization of the first oxidized regions 31B proceeds also in the direction parallel to the substrate surface (the lateral direction), whereby if the width dimension of the first mask film 25 is set to be 0.5 μm in the patterning process, for example, the width dimension of the base region 31a after the oxidization process can be as small as about 0.25 μm. Moreover, since an oxygen gas or a water-vapor-containing atmosphere is used as an oxidizing atmosphere for selectively oxidizing the first oxidized regions 31B, a quick and uniform oxidization process can be performed reproducibly.

Figure 20C:
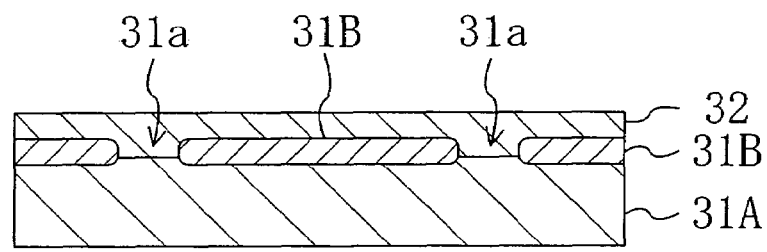

Next, as illustrated in FIG. 20C, the first mask film 25 is removed by an RIE method, for example, and then the first semiconductor layer 32 made of silicon carbide is selectively grown (through an ELO process) on the surface of the base region 31a that is exposed between the plurality of first oxidized regions 31B in the substrate 31A so as to cover the first oxidized regions 31B by a CVD method under conditions such that the lateral growth is dominant.

Figure 20D:
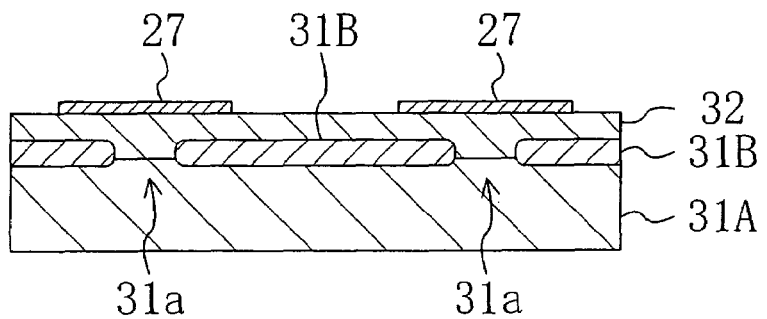

Next, as illustrated in FIG. 20D, the second mask film 27 made of silicon nitride and having a thickness of about 100 nm is formed by a method similar to that for the first mask film 25 so that each second mask film 27 masks a portion of the first semiconductor layer 32 above the base region 31a and has an opening above the first oxidized region 31B.

Figure 21A:
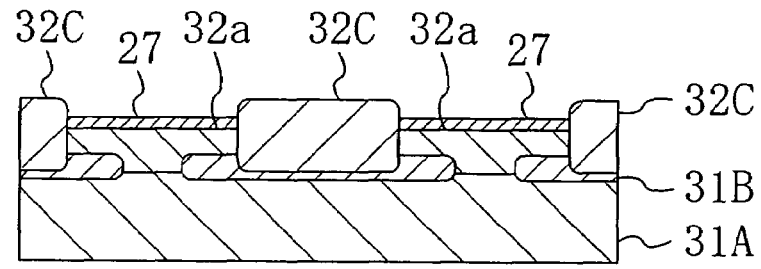
FIG. 21A to FIG. 21C are cross-sectional views sequentially illustrating steps in the method for manufacturing a semiconductor thin film according to the eleventh embodiment of the present invention.

Next, as illustrated in FIG. 21A, the substrate 31A with the first semiconductor layer 32 and the second mask film 27 formed thereon is subjected to a heat treatment at a temperature of 1000° C., for example, in an oxygen gas or a water-vapor-containing atmosphere. Through the heat treatment, the plurality of second oxidized regions 32C made of silicon oxide are formed through oxidization of the first semiconductor layer 32 in regions of the first semiconductor layer 32 that are not covered by the second mask film 27. As a result, the base layer 32a made of silicon carbide is formed in each region in the first semiconductor layer 32 that is interposed by adjacent second oxidized regions 32C.

Figure 21B:
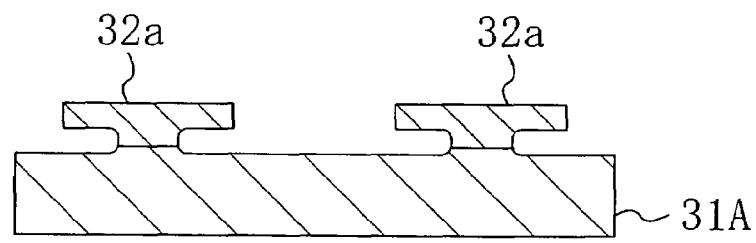

Next, as illustrated in FIG. 21B, the plurality of first oxidized regions 31B and the plurality of second oxidized regions 32C are removed by an acidic aqueous solution such as hydrogen fluoride water. Thus, each base layer 32a has overhang side portions.

Figure 21C:
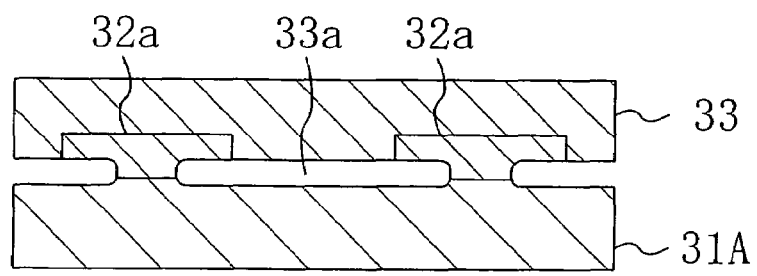

Next, as illustrated in FIG. 21C, the second semiconductor layer 33 made of silicon carbide is grown under growth conditions such that the ELO process with the base layer 32a being a seed crystal is dominant. Thus, the gap portion 33a is formed between the lower surface of the second semiconductor layer 33 and the principal surface of the substrate 31A, whereby the second semiconductor layer 33 is grown without being influenced by the surface of the second oxidized regions 32C. Again, an HVPE method may be used as the crystal growth method for the first semiconductor layer 12A, the second semiconductor layer 14 and the third semiconductor layer 16. Furthermore, an MBE method may be used for the first semiconductor layer 12A.

As described above, in the eleventh embodiment, the following effect can be obtained in addition to those of the tenth embodiment. Since the second semiconductor layer 33 is formed on the substrate 11 so that the gap portion 33a obtained by removing the first oxidized regions 12B and the second oxidized regions 14B is retained, whereby the growth of the second semiconductor layer 33 is not influenced by the surface of the second oxidized regions 32C, thus further improving the crystallinity of the second semiconductor layer 33. In addition, the gap portion 33a reduces the stress in the second semiconductor layer 33 due to the lattice mismatch occurring while growing the second semiconductor layer 33.

Note that while silicon carbide (SiC) is used for the single-crystal substrate 31A, silicon (Si), gallium arsenide (GaAs), indium phosphide (InP) or gallium phosphide (GaP) may alternatively be used instead of silicon carbide.

Twelfth Embodiment

The twelfth embodiment of the present invention will now be described with reference to the drawings.

FIG. 22A to FIG. 22E are cross-sectional views sequentially illustrating steps in a method for manufacturing a semiconductor thin film according to the twelfth embodiment of the present invention.

Figure 22A:
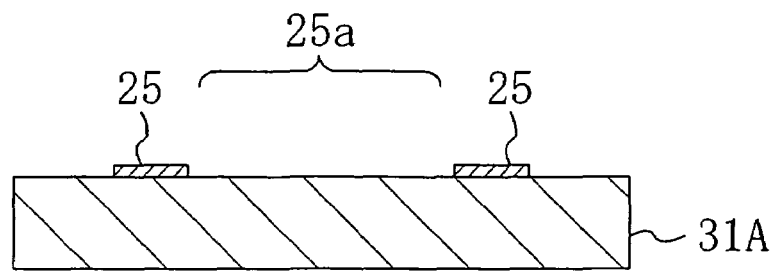
FIG. 22A to FIG. 22E are cross-sectional views sequentially illustrating steps in a method for manufacturing a semiconductor thin film according to a twelfth embodiment of the present invention.

First, as illustrated in FIG. 22A, a mask-forming film made of silicon nitride and having a thickness of about 100 nm is deposited on the principal surface of the substrate 31A made of silicon carbide whose principal surface is oriented along the (0001) plane by, for example, a plasma CVD method. Then, a resist pattern having a planar stripe pattern (not shown), for example, is formed on the mask-forming film by a photolithography method, and then the mask-forming film is dry-etched by, for example, an RIE method with a reactive gas containing fluorocarbon using the formed resist pattern as a mask, thereby forming, from the mask-forming film, a mask film 25 having a stripe pattern with an opening 25$a$ therein. Then, the resist pattern is removed by ashing, or the like. Herein, an optical pattern exposure system capable of performing minute processing with a resolution of about 0.5 µm or better in terms of pattern width, such as a contact mask aligner apparatus or a g-ray stepper, is used. Note that while a stripe pattern is used as the planar shape of the mask film 25, it may alternatively be a dotted (island-like) pattern.

Figure 22B:
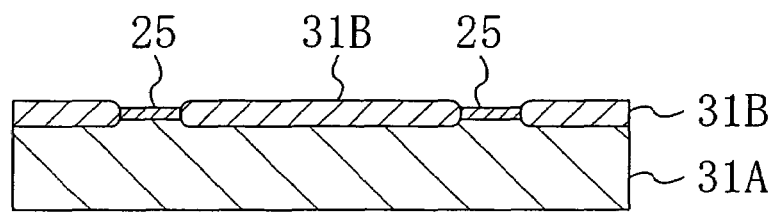

Next, as illustrated in FIG. 22B, the substrate 31A with the mask film 25 formed thereon is subjected to a heat treatment at a temperature of 1000° C., for example, in an oxygen gas or a water-vapor-containing atmosphere. Through the heat treatment, the plurality of oxidized regions 31B made of silicon oxide are formed through oxidization of the substrate 31A in regions of the substrate 31A that are not covered by the mask film 25. As a result, a base region 31$a$ is formed in each region in the upper portion of the substrate 31A that is interposed by adjacent oxidized regions 31B. Herein, the oxidization of the oxidized regions 31B proceeds also in the direction parallel to the substrate surface (the lateral direction), whereby if the width dimension of the mask film 25 is set to be 0.5 µm in the patterning process, for example, the width dimension of the base region 31$a$ after the oxidization process can be as small as about 0.25 µm. Moreover, since an oxygen gas or a water-vapor-containing atmosphere is used as an oxidizing atmosphere for selectively oxidizing the oxidized regions 31B, a quick and uniform oxidization process can be performed reproducibly.

Figure 22C:
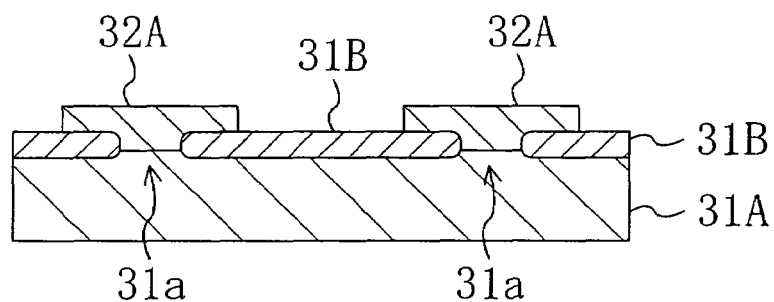

Next, as illustrated in FIG. 22C, the mask film 25 is removed by an RIE method, and then a first semiconductor layer 32A made of silicon carbide is selectively grown (through an ELO process) by a CVD method on the surface of the base region 31$a$ that is exposed between the plurality of oxidized regions 12B so as to leave an exposed portion in the central portion of the upper surface of each oxidized region 31B. Thus, the growth of the first semiconductor layers 32A, which are grown through an ELO process, is stopped before the opposing end surfaces of adjacent first semiconductor layers 32A that are growing toward each other come into contact with each other.

Figure 22D:
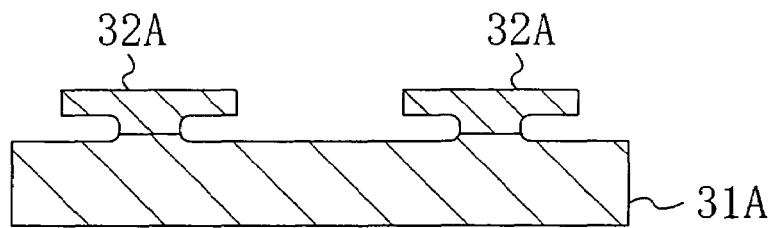

Next, as illustrated in FIG. 22D, the plurality of oxidized regions 31B are removed by an acidic aqueous solution such as hydrogen fluoride water. Thus, each first semiconductor layer 32A has overhang side portions.

Figure 22E:
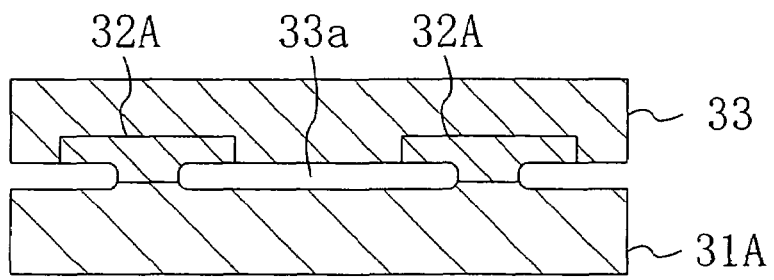

Next, as illustrated in FIG. 22E, the second semiconductor layer 33 made of silicon carbide is grown by a CVD method under growth conditions such that the ELO process with the first semiconductor layer 32A being the base crystal layer is dominant. In this process, the gap portion 33$a$ is formed between the lower surface of the second semiconductor layer 33 and the principal surface of the substrate 31A, whereby the second semiconductor layer 33 is grown without being influenced by either the surface of the oxidized regions 31B or the surface of the substrate 31A.

As described above, in the twelfth embodiment, as in the eighth embodiment, the crystallinity of the first semiconductor layer 32A and that of the second semiconductor layer 33 are both improved by the ELO process proceeding from the base region 31$a$ having a reduced exposed area. Moreover, in the twelfth embodiment, the second semiconductor layer 33 is grown on the substrate 31A so that the gap portion 33$a$ obtained by removing the oxidized regions 31B is retained, whereby the growth of the second semiconductor layer 33 is not influenced by the surface of the substrate 31A or that of the oxidized regions 31B. As a result, the crystallinity of the second semiconductor layer 33 is improved as compared with a case where the oxidized regions 31B are not removed. In addition, the gap portion 33$a$ also has an effect of reducing the stress in the second semiconductor layer 33 due to the lattice mismatch occurring while growing the second semiconductor layer 33.

Note that while silicon carbide (SiC) is used for the single-crystal substrate 31A, silicon (Si), gallium arsenide (GaAs), indium phosphide (InP) or gallium phosphide (GaP) may alternatively be used instead of silicon carbide.

Thirteenth Embodiment

The thirteenth embodiment of the present invention will now be described with reference to the drawings.

FIG. 23A to FIG. 23D and FIG. 24A to FIG. 24C are cross-sectional views sequentially illustrating steps in a method for manufacturing a semiconductor thin film according to the thirteenth embodiment of the present invention.

Figure 23A:
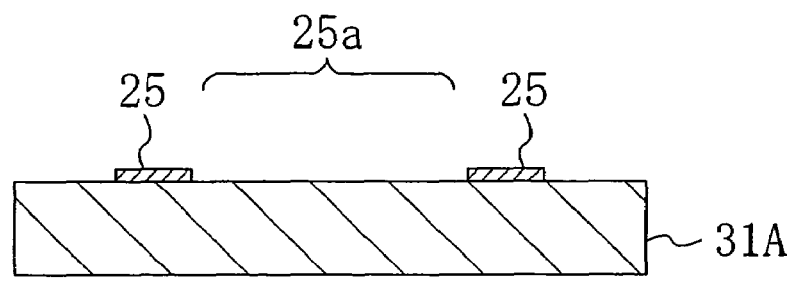
FIG. 23A to FIG. 23D are cross-sectional views sequentially illustrating steps in a method for manufacturing a semiconductor thin film according to a thirteenth embodiment of the present invention.

First, as illustrated in FIG. 23A, a first mask-forming film made of silicon nitride and having a thickness of about 100 nm is deposited on the principal surface of the substrate 31A made of silicon carbide whose principal surface is oriented along the (0001) plane by, for example, a plasma CVD method. Then, a resist pattern having a planar stripe pattern (not shown), for example, is formed on the first mask-forming film by a photolithography method, and then the first mask-forming film is dry-etched by, for example, an RIE method with a reactive gas containing fluorocarbon using the formed resist pattern as a mask, thereby forming, from the first mask-forming film, the first mask film 25 having a stripe pattern with the opening 25$a$ therein. Then, the resist pattern is removed by ashing, or the like. Herein, an optical pattern exposure system capable of performing minute processing with a resolution of about 0.5 µm or better in terms of pattern width, such as a contact mask aligner apparatus or a g-ray stepper, is used. Note that while a stripe pattern is used as the planar shape of the first mask film 25, it may alternatively be a dotted (island-like) pattern.

Figure 23B:
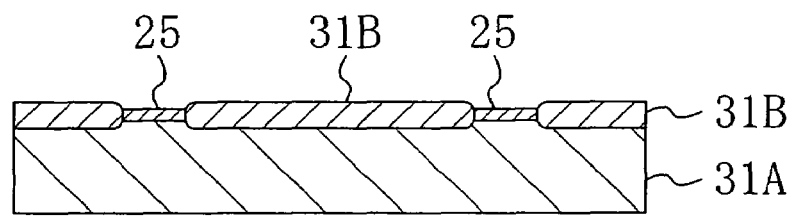

Next, as illustrated in FIG. 23B, the substrate 31A with the first mask film 25 formed thereon is subjected to a heat treatment at a temperature of 1000° C., for example, in an oxygen gas or a water-vapor-containing atmosphere. Through the heat treatment, the plurality of first oxidized regions 31B made of silicon oxide are formed through oxidization of the substrate 31A in regions of the substrate 31A that are not covered by the first mask film 25. As a result, the base region 31$a$ is formed in each region in the upper portion of the substrate 31A that is interposed by adjacent first oxidized regions 31B. Herein, the oxidization of the first oxidized regions 31B proceeds also in the direction parallel to the substrate surface (the lateral direction), whereby if the width dimension of the first mask film 25 is set to be 0.5 µm in the patterning process, for example, the width dimension of the base region 31$a$ after the oxidization process can be as small as about 0.25 µm. Moreover, since an oxygen gas or a water-vapor-containing atmosphere is used as an oxidizing atmosphere for selectively oxidizing the first oxidized regions 31B, a quick and uniform oxidization process can be performed reproducibly.

Figure 23C:
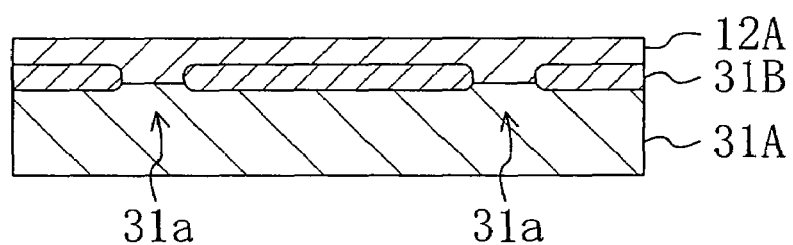

Next, as illustrated in FIG. 23C, the first mask film 25 is removed by an RIE method, and then the first semiconductor layer 12A made of gallium nitride is selectively grown (through an ELO process) by an MOCVD method on the surface of the base region 31a that is exposed between the plurality of first oxidized regions 31B so as to cover the first oxidized regions 31B.

Figure 23D:
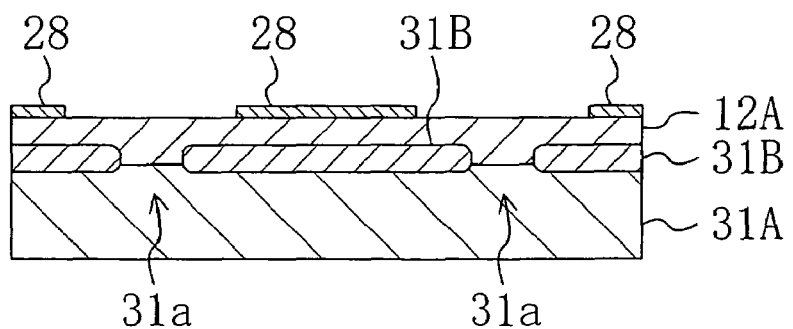

Next, as illustrated in FIG. 23D, a second mask film 28 made of silicon and having a thickness of about 100 nm is formed by, for example, a CVD method in which monosilane is decomposed so that the second mask film 28 has a plurality of openings for exposing therethrough portions of the first semiconductor layer 12A that are above the base regions 31a.

Figure 24A:
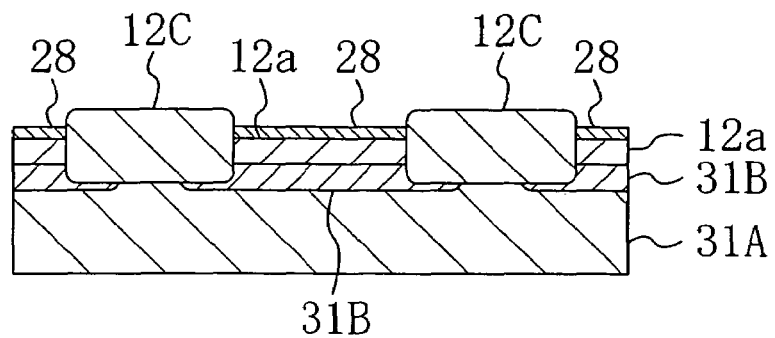
FIG. 24A to FIG. 24C are cross-sectional views sequentially illustrating steps in the method for manufacturing a semiconductor thin film according to the thirteenth embodiment of the present invention.

Next, as illustrated in FIG. 24A, the substrate 31A with the first semiconductor layer 12A and the first mask film 28 formed thereon is subjected to a heat treatment at a temperature of 900° C. for about 4 hours, for example, in an oxygen gas or a water-vapor-containing atmosphere. Through the heat treatment, a plurality of first oxidized regions 12C made of gallium oxide are formed through oxidization of the first semiconductor layer 12A in regions of the first semiconductor layer 12A that are not covered by the first mask film 28. As a result, the base layer 12a made of gallium nitride is formed in each region of the first semiconductor layer 12A that is interposed by adjacent second oxidized regions 12C. Herein, the base region 31a is taken over by the second oxidized region 12C, whereby the entire principal surface of the substrate 31A is covered by an oxide made of silicon oxide and gallium oxide.

Figure 24B:
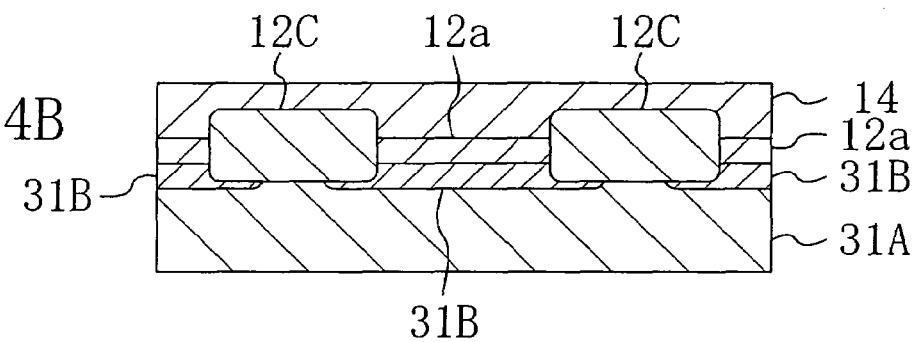

Next, as illustrated in FIG. 24B, the second mask film 28 is removed by hydrofluoric-nitric acid or an RIE method, and then the second semiconductor layer 14 made of gallium nitride is selectively grown (through an ELO process) by an MOCVD method on the surface of the base layer 12a that is exposed between the plurality of second oxidized regions 12C so as to cover the second oxidized regions 12C.

Figure 24C:
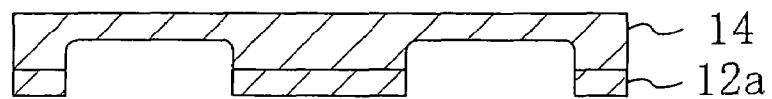
Figure 25A:
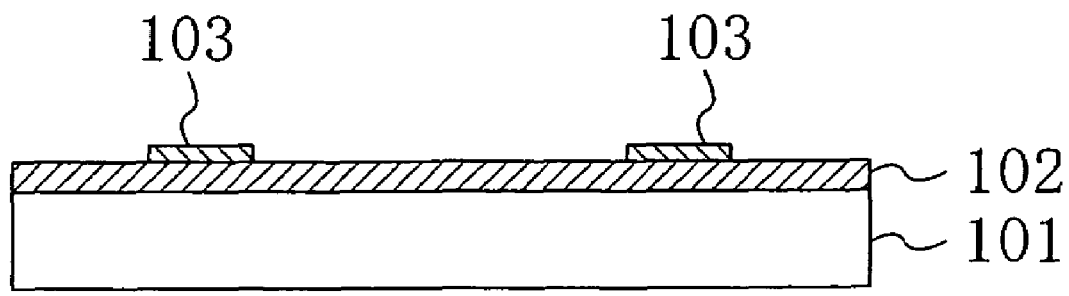
FIG. 25A and FIG. 25B are cross-sectional views sequentially illustrating steps in a conventional method for manufacturing a semiconductor thin film.
Figure 25B:
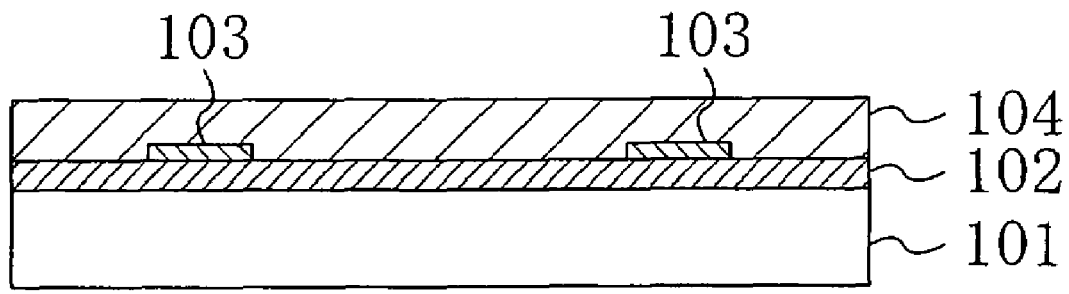

Next, as illustrated in FIG. 24C, the plurality of first oxidized regions 31B and the plurality of second oxidized regions 32B are removed by wet etching. Thus, the substrate 31A and the second semiconductor layer 33 can be separated from each other easily, uniformly and reproducibly even if the substrate 31A has a large area.

Herein, the etchant for the first oxidized regions 31B made of silicon oxide may be, for example, hydrogen fluoride water or buffered hydrogen fluoride, and the etchant for the second oxidized regions 12C made of gallium oxide may be hydrogen chloride water or ammonia water.

Thus, in the thirteenth embodiment, the following effect can be obtained in addition to those of the eighth embodiment. By separating the substrate 31A for forming the base region 31a and the base layer 12a from the second semiconductor layer 14, the substrate 31A can be reused. In this way, since the substrate 31A made of silicon carbide is typically expensive, it is possible to reduce the manufacturing cost for manufacturing a device using the second semiconductor layer 33 by reusing the substrate 31A.

Alternatively, as in the second embodiment, the substrate 31A may be separated after bonding a support substrate made of silicon (Si) whose principal surface is oriented along the (100) plane to the upper surface of the second semiconductor layer 14.

Note that while silicon carbide (SiC) is used for the single-crystal substrate 31A, silicon (Si), gallium arsenide (GaAs), indium phosphide (InP) or gallium phosphide (GaP) may alternatively be used instead of silicon carbide.

Moreover, the orientation of the principal surface of the substrates 11 and 31 used in the embodiments described above is not limited to the (0001) plane. Furthermore, the substrates 11 and 31 may be provided with a so-called "off-angle" by offsetting it slightly from the typical orientation such as the (0001) plane.

Moreover, while gallium nitride is used for the second semiconductor layer 14, which is the semiconductor thin film of interest, in the first, second and thirteenth embodiments, a mixed crystal to which indium or aluminum is added may alternatively be used. Furthermore, a device structure including a hetero junction such as a quantum well structure, for example, using these mixed crystals may be formed in the second semiconductor layer 14.

Similarly in the third to seventh embodiments, a device structure including a hetero junction using a mixed crystal of InGaAlNAs may be formed in the third semiconductor layer 16. Moreover, also in the eighth to twelfth embodiments, a device structure may be formed in the first semiconductor layer 32 or the second semiconductor layer 33.

Moreover, in embodiments where the substrate 11 or the substrate 31A is not separated from the grown semiconductor layer, the substrates 11 and 31A may be separated from the semiconductor layer by irradiating the substrates 11 and 31A with irradiation light whose energy is smaller than the forbidden band width of the material of the substrates 11 and 31A and is larger than the forbidden band width of the semiconductor. In such a case, oxidized regions may be selectively removed by heating the substrates 11 and 31A to about 500° C. or by using an acidic or alkaline aqueous solution.

What is claimed is:

1. A method for manufacturing a semiconductor thin film, comprising:
   a first step of forming a first semiconductor thin film on a single-crystal substrate;
   a second step of selectively forming a mask film with a plurality of openings therein on the first semiconductor thin film;
   a fourth step of subjecting the first semiconductor thin film with the mask film formed thereon to a heat treatment in an oxidizing atmosphere to oxidize portions of the first semiconductor thin film that are exposed through the openings of the mask film and a vicinity thereof, thereby forming a plurality of oxidized regions in the first semiconductor thin film;
   a fifth step of removing the mask film to expose the first semiconductor thin film and then forming a second semiconductor thin film on the exposed first semiconductor thin film so as to cover the plurality of oxidized regions;
   a sixth step, after said fifth step, of separating the substrate from the first semiconductor thin film,
   wherein the sixth step includes a step of irradiating the substrate with irradiation light whose energy is smaller than a forbidden band width of a material of the substrate and is larger than a forbidden band width of a material of the first semiconductor thin film.

2. The method for manufacturing a semiconductor thin film of claim 1, further comprising, between the fifth step and the sixth step, a seventh step of bonding a support substrate made of a material different from that of the second semiconductor thin film on an upper surface of the second semiconductor thin film.

3. The method for manufacturing a semiconductor thin film of claim 2, wherein the support substrate is made of silicon, gallium arsenide, indium phosphide, gallium phosphide or a metal.

4. The method for manufacturing a semiconductor thin film of claim 1, wherein the irradiation light is pulsed laser light.

5. The method for manufacturing a semiconductor thin film of claim 1, wherein the irradiation light is an emission line of a mercury lamp.

6. The method for manufacturing a semiconductor thin film of claim 1, wherein the sixth step includes a step of heating the substrate.

7. The method for manufacturing a semiconductor thin film of claim 1, wherein in the sixth step, the irradiation light is radiated so as to scan a surface of the substrate.

8. The method for manufacturing a semiconductor thin film of claim 1 wherein the substrate is made of sapphire, silicon carbide, lithium aluminum oxide, lithium gallium oxide, lithium gallium aluminum oxide ($LiGa_xAl_{1-x}O_2$ (where $0 \leq x \leq 1$)), silicon, gallium arsenide, indium phosphide or gallium phosphide.

9. The method for manufacturing a semiconductor thin film of claim 1, wherein at least one of the first semiconductor thin film and the second semiconductor thin film is made of a group III-V nitride semiconductor or silicon carbide.

10. The method for manufacturing a semiconductor thin film of claim 1, wherein at least one of the first semiconductor thin film and the second semiconductor thin film is deposited by a vapor deposition method, a metal organic chemical vapor deposition method, a hydride vapor phase epitaxy method or a molecular beam epitaxy method.

11. The method for manufacturing a semiconductor thin film of claim 1, wherein the first semiconductor thin film and the second semiconductor thin film are deposited by different deposition methods.

12. The method for manufacturing a semiconductor thin film of claim 1, wherein the oxidizing atmosphere is an oxygen gas.

13. The method for manufacturing a semiconductor thin film of claim 1, wherein the oxidizing atmosphere contains water vapor.

* * * * *